(12) United States Patent
Nishizaki

(10) Patent No.: US 9,142,629 B2
(45) Date of Patent: Sep. 22, 2015

(54) SEMICONDUCTOR DEVICE HAVING SHARED DIFFUSION LAYER BETWEEN TRANSISTORS

(71) Applicant: Micron Technology, Inc., Boise, ID (US)

(72) Inventor: Mamoru Nishizaki, Chuo-ku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/447,976

(22) Filed: Jul. 31, 2014

(65) Prior Publication Data

US 2015/0035054 A1 Feb. 5, 2015

(30) Foreign Application Priority Data

Aug. 1, 2013 (JP) ................................. 2013-160342

(51) Int. Cl.

| H01L 27/02 | (2006.01) |
| H01L 29/423 | (2006.01) |
| H01L 27/092 | (2006.01) |
| H01L 29/78 | (2006.01) |

(52) U.S. Cl.
CPC ...... *H01L 29/42376* (2013.01); *H01L 27/0207* (2013.01); *H01L 27/0922* (2013.01); *H01L 29/7817* (2013.01)

(58) Field of Classification Search
CPC ............ H01L 29/76; H01L 2924/0002; H01L 29/7833; H01L 27/0207; H01L 27/0922; H01L 29/7817; H03K 19/0016

USPC .................................................. 257/369, 338
See application file for complete search history.

(56) References Cited

U.S. PATENT DOCUMENTS

| 5,486,774 A * | 1/1996 | Douseki et al. ................. 326/33 |
| 6,215,159 B1 * | 4/2001 | Fujita et al. .................... 257/369 |
| 7,436,205 B2 * | 10/2008 | Tada ............................... 326/33 |
| 7,825,438 B2 * | 11/2010 | Jung et al. ...................... 257/233 |
| 8,063,443 B2 * | 11/2011 | Cai ................................. 257/335 |
| 8,154,084 B2 * | 4/2012 | Hoentschel et al. .......... 257/369 |
| 8,169,030 B2 * | 5/2012 | Masuoka et al. .............. 257/368 |
| 8,227,861 B2 * | 7/2012 | Yang et al. ..................... 257/338 |
| 2009/0184758 A1 * | 7/2009 | Motomura .................... 327/544 |
| 2011/0147837 A1 * | 6/2011 | Hafez et al. ................... 257/338 |

* cited by examiner

*Primary Examiner* — Nathan Ha
(74) *Attorney, Agent, or Firm* — Schwegman Lundberg & Woessner, P.A.

(57) ABSTRACT

A device includes a first transistor including a first gate electrode including first and second parallel electrode portions each extending in a first direction, and a first connecting electrode portion extending in a second direction approximately orthogonal to the first direction and connecting one ends of the first and second parallel electrode portions to each other, and first and second diffusion layers separated from each other by a channel region under the first gate electrode, a first output line connected to the first diffusion layer of the first transistor, and a second transistor comprising a second gate electrode extending in the second direction, and the second transistor being configured to use the second diffusion layer of the first transistor as one of two diffusion layers that are separated from each other by a channel region under the second gate electrode.

18 Claims, 19 Drawing Sheets

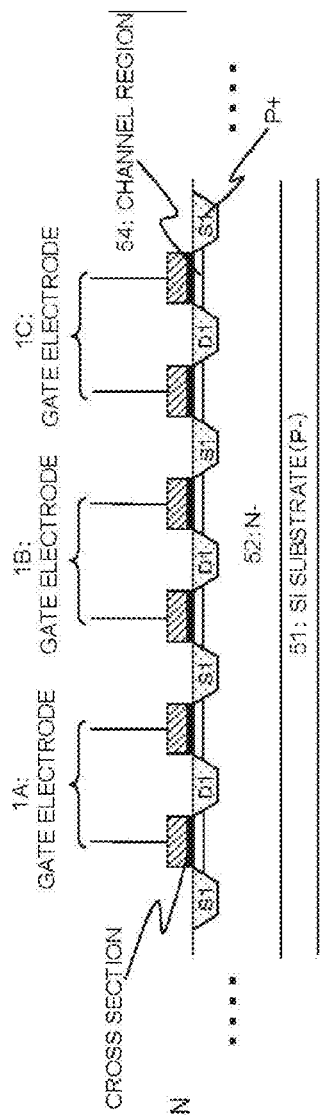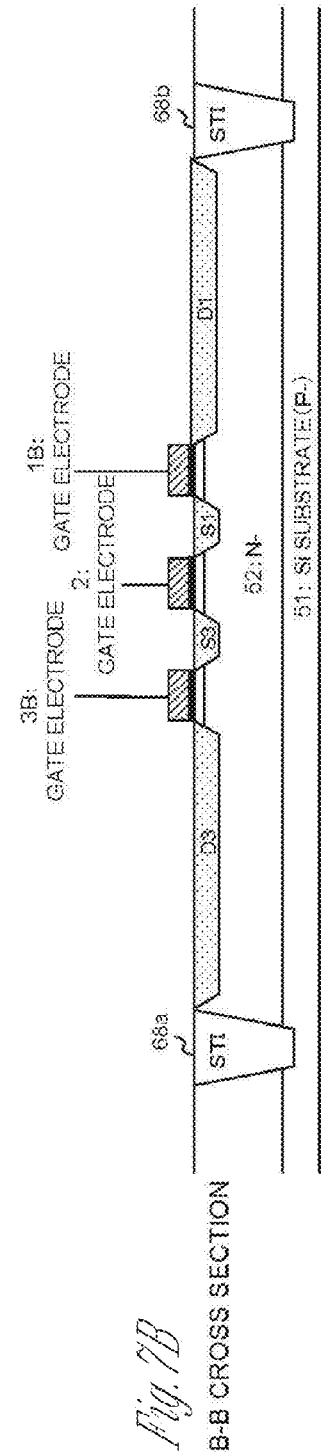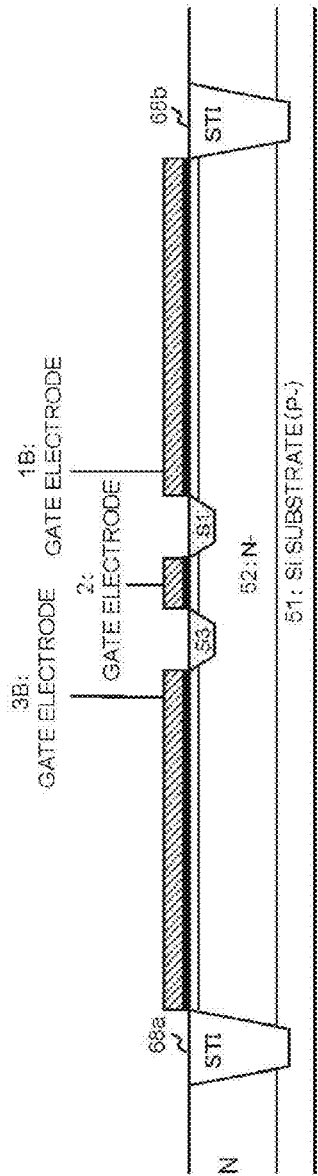
Fig. 7A  A-A CROSS SECTION
Fig. 7B  B-B CROSS SECTION
Fig. 7C  C-C CROSS SECTION

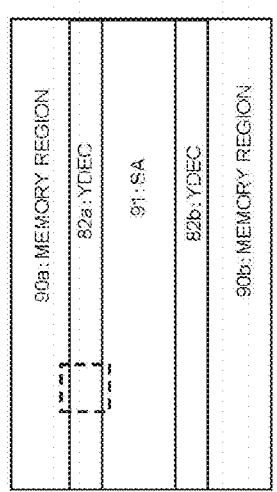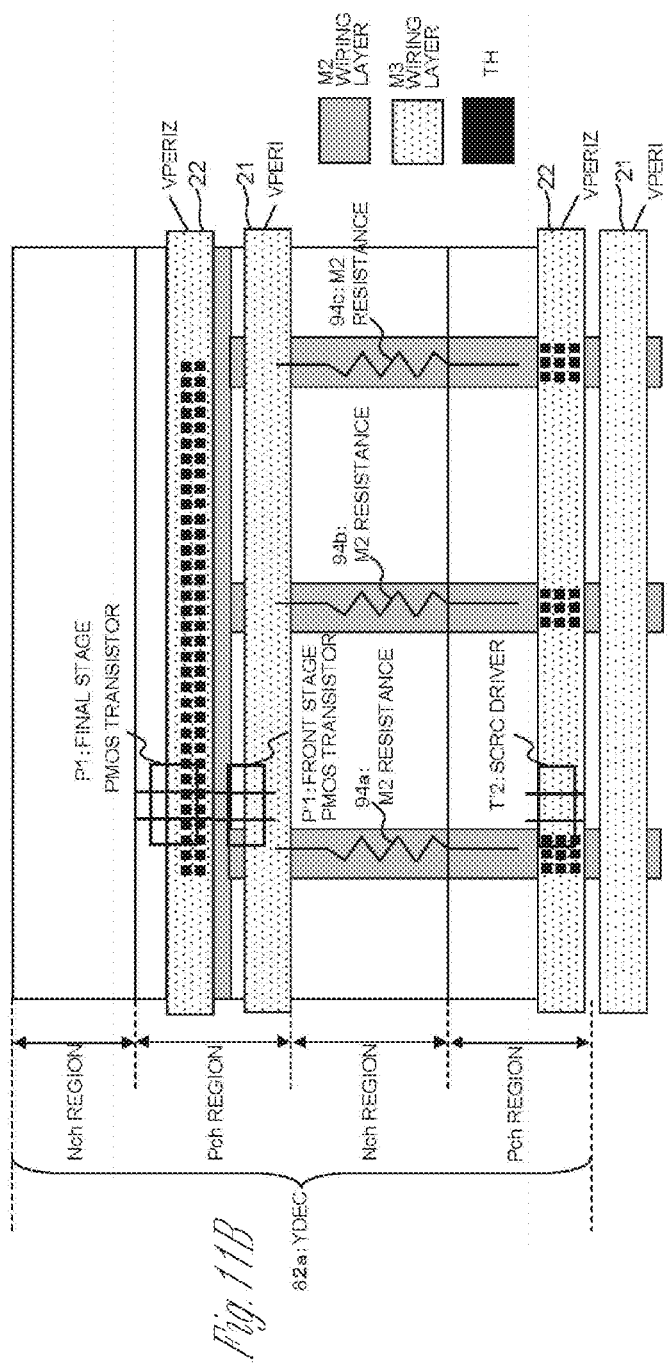

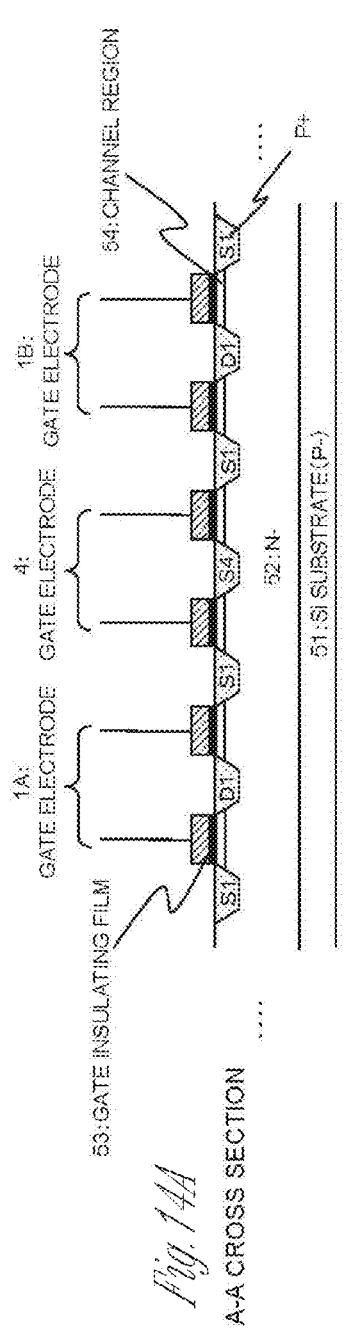
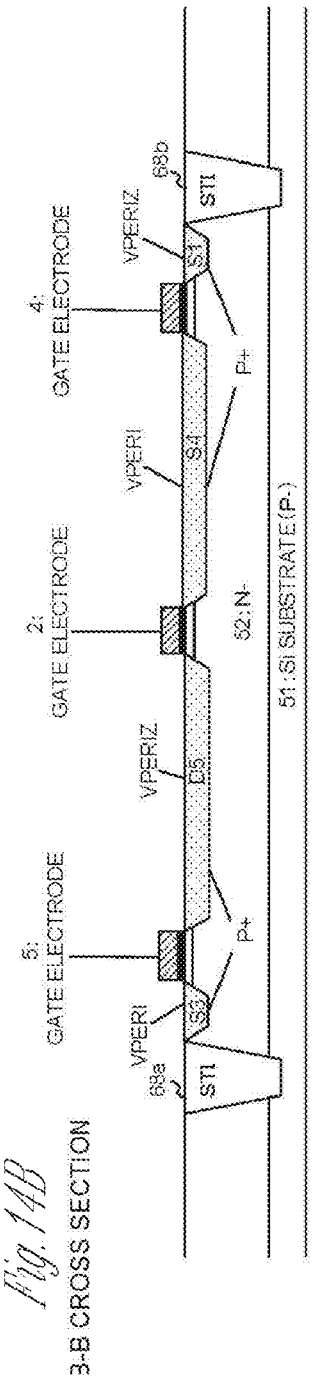
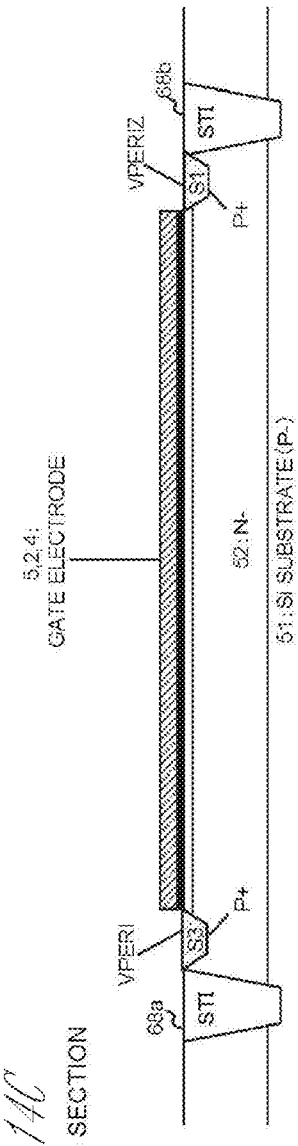
Fig. 14A A-A CROSS SECTION
Fig. 14B B-B CROSS SECTION
Fig. 14C C-C CROSS SECTION Fig. 17A A-A CROSS SECTION Fig. 17B B-B CROSS SECTION

C-C CROSS SECTION

SEMICONDUCTOR DEVICE HAVING SHARED DIFFUSION LAYER BETWEEN TRANSISTORS

PRIORITY CLAIM

This application is based upon and claims the benefit of the priority of Japanese patent application No. 2013-160342, filed on Aug. 1, 2013, under 35 U.S.C. 119(a), the disclosure of which is incorporated herein in its entirety by reference thereto.

BACKGROUND

It has conventionally been thought that if a clock is stopped in a CMOS semiconductor integrated circuit, no consumption current flows. However, if a subthreshold current flows, even if the clock is stopped, consumption current flows. Thus, as a technique for reducing such subthreshold current in a standby state, a power gating technique has begun to be used widely. This power gating technique is for blocking power supply to internal circuits while maintaining an output node potential that needs to be held in a standby state.

U.S. Pat. No. 8,499,272 ('272 patent) discloses a semiconductor device that uses a power gating technique and that suppresses an increase in the resistance of power supply and ground lines. In the semiconductor device, a plurality of circuit cells are arranged in separate circuit cell shelves. More specifically, a plurality of circuit cells are divided into a group of circuit cells, each using a main power supply line (potential VPERI) and a pseudo-ground line (potential VSSZ). The plurality of circuit cells are further divided into a group of circuit cells each using a pseudo-power supply line (potential VPERIZ) and a main ground line (potential VSS). In this way, since the power supply and ground lines in each circuit cell shelf can have a larger interconnect width, an increase in the resistance of the power supply and ground lines is suppressed (see FIGS. 3 and 5 in the '272 patent).

However, in the semiconductor device disclosed in the '272, a functional circuit region and a driver region are separated from each other (see FIG. 3 in the '272 patent). Thus, there is a problem in that the layout regions for these elements are increased. In addition, regarding a circuit cell in the functional circuit region arranged far from the driver region, there can be a large distance (interconnect length) between the circuit cell and a Subthreshold Current Reduction Circuit (SCRC) driver. Thus, there is a problem that the interconnect resistance cannot be sufficiently suppressed. In this case, when the circuit cell is operated, the interconnect resistance causes waveform distortion in voltages of the power supply and ground lines, imposing a limit on improvement of the speed of a circuit operation in the semiconductor device.

BRIEF DESCRIPTION OF THE DRAWINGS

FIGS. 7A to 7C are cross sections taken along lines A-A, B-B, and C-C in FIG. 6, respectively.

FIGS. 11A to 11C are diagrams for illustrating the interconnect resistance of the column decoder in the semiconductor device according to a comparative example 1.

FIGS. 14A to 14C are cross sections taken along lines A-A, B-B, and C-C in FIG. 13, respectively.

DETAILED DESCRIPTION

Figure 1:
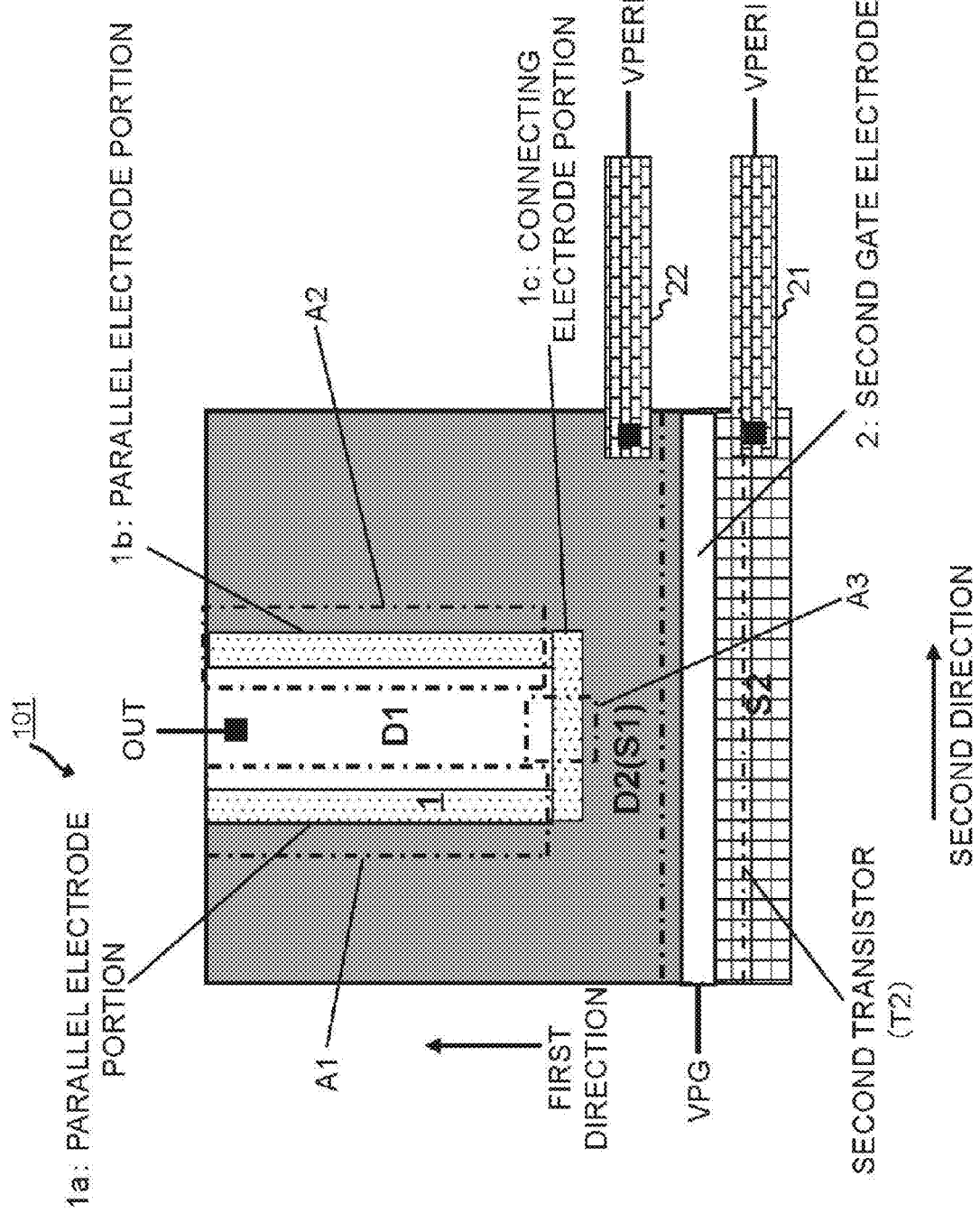
FIG. 1 illustrates a layout of a semiconductor device according to an exemplary embodiment.

The reference characters in the following discussion of exemplary embodiments are merely used as examples to facilitate understanding of the present invention. These reference characters are not to limit the present invention to the illustrated modes.

Figure 2:
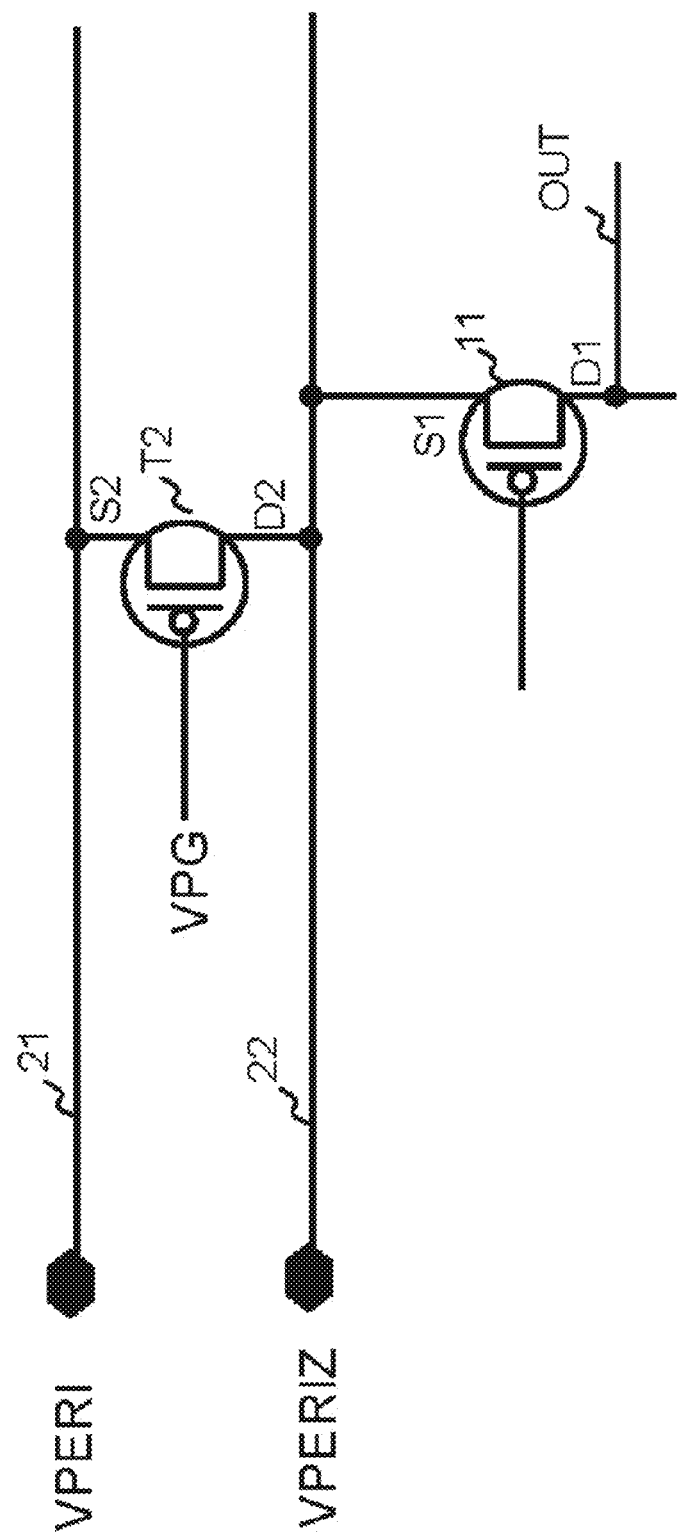
FIG. 2 is an equivalent circuit diagram of FIG. 1.

FIG. 1 illustrates a layout of a semiconductor device according to an exemplary embodiment. FIG. 2 is an equivalent circuit diagram of FIG. 1.

A device 101, illustrated in FIG. 1, includes: a first transistor (A1 to A3 in FIG. 1; 11 in FIG. 2) comprising: a first gate electrode 1 including first and second parallel electrode portions (1a and 1b) each extending in a first direction, and a first connecting electrode portion (1c) extending in a second direction approximately orthogonal (e.g., not exactly orthogonal) to the first direction and connecting one ends of the first and second parallel electrode portions (1a and 1b) to each other; and first and second diffusion layers (drain D1 and source S1) separated from each other by a channel region under the first gate electrode; a first output line OUT connected to the first diffusion layer (drain D1) of the first transistor; and a second transistor T2 comprising a second gate electrode 2 extending in the second direction. The second transistor T2 is configured to use the second diffusion layer (source S1) of the first transistor as one (drain D2 in FIG. 1) of two diffusion layers that are separated from each other by a channel region under the second gate electrode 2.

According to an exemplary embodiment based on the device 101, the second transistor T2 and the first transistor 11 can share a diffusion layer (as the drain D2 of the second transistor and as the source S1 of the first transistor in FIG. 1). In this way, the device 101 that uses power gating can have reduced interconnect resistance. In addition, for example, the first transistor having a gate electrode having two parallel electrode portions and a connecting electrode portion connecting the two parallel electrode portions can be used as a component of an inverter circuit. The second transistor can be used as an SCRC transistor of the inverter circuit. Since these first and second transistors can share a diffusion layer, the layout area and the interconnect resistance can be reduced.

A configuration of a semiconductor device 100, according to a first exemplary embodiment, will be described with reference to FIGS. 3 to 9.

Figure 3:
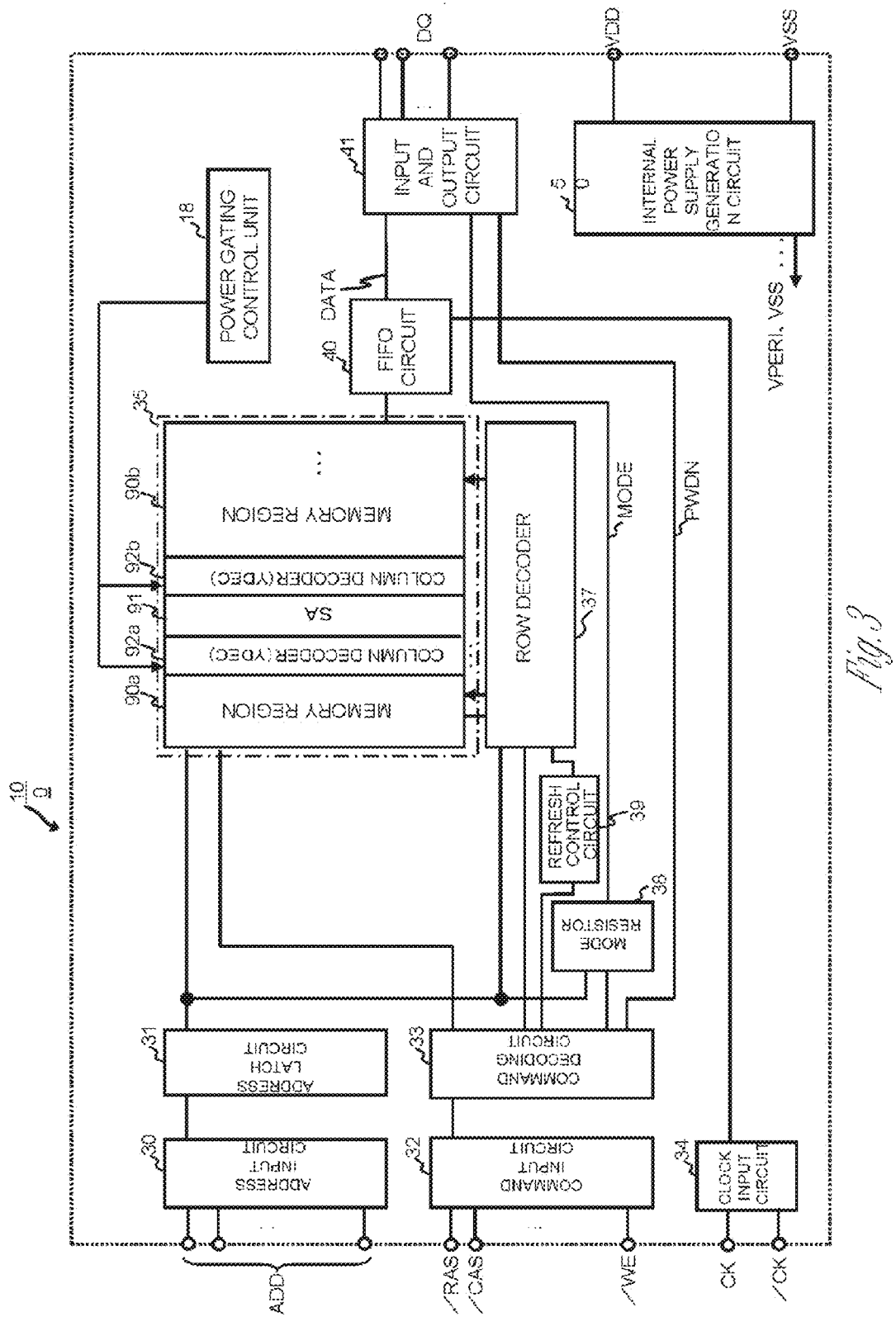
FIG. 3 is a block diagram illustrating an overall configuration of a semiconductor device according to a first exemplary embodiment.

FIG. 3 is a block diagram illustrating an overall configuration of the semiconductor device 100 according to the first exemplary embodiment. The semiconductor device 100 illustrated in FIG. 3 is a dynamic random access memory (DRAM) including, as external terminals, external clock terminals CK and /CK, command terminals /RAS, /CAS, and /WE, address terminals ADD, power supply terminals VDD and VSS, and data input/output terminals DQ. In the present description, signals whose name starts with a "/" can be either inverted signals of the respective signals or active-low signals. Thus, external clock signals CK and /CK are complementary to each other while /RAS, /CAS, and /WE are active low signals.

A clock input circuit 34 receives the external clock signals CK and /CK, generates an internal clock signal, and supplies the internal clock signal to a first-in first-out (FIFO) circuit 40, for example.

The command terminals /RAS, /CAS, and /WE are supplied with a row address strobe signal /RAS, a column address strobe signal /CAS, and a write enable signal /WE, respectively. These command signals are supplied to a command decoding circuit 33 via a command input circuit 32. The command decoding circuit 33 generates various internal commands.

The various internal commands outputted from the command decoding circuit 33 are supplied to a row decoder 37, column decoders 92a and 92b, a refresh control circuit 39, a mode resistor 38, and an input and output circuit 41, for example.

When the mode resistor 38 is supplied with a mode setting command by the command decoding circuit 33, the mode register 38 sets data supplied via an internal address bus in the mode resistor 38. The mode resistor 38 supplies a mode signal MODE to the input and output circuit 41.

When the refresh control circuit 39 is supplied with a refresh command by the command decoding circuit 33, the refresh control circuit 39 controls the row decoder 37 so that a refresh address is generated from the row decoder 37 in accordance with refresh timing.

Address signals ADD supplied to the address terminals are supplied to an address latch circuit 31 via an address input circuit 30. The address latch circuit 31 latches the address signals ADD in synchronization with an internal clock signal.

As illustrated in FIG. 3, a memory cell array 35 is arranged by dividing a plurality of memory regions (90a and 90b, for example), and the column decoders 92a and 92b and a sense amplifier (SA) 91 are arranged near the respective memory cell regions.

The address signals ADD include a row address determining a word line (not illustrated) and a column address determining a bit line (not illustrated). Among the address signals latched by the address latch circuit 31, a row address is supplied to the row decoder 37 and a column address is supplied to the column decoders 92a and 92b.

Among a plurality of word lines, the row decoder 37 selects a word line corresponding to the row address supplied from the address latch circuit 31.

Among a plurality of bit lines, the column decoders 92a and 92b select a bit line corresponding to the column address supplied from the address latch circuit 31. The SA (sense amplifier) 91 connected to the selected bit line is electrically connected to a data amplifier (not illustrated), and an output from this data amplifier is supplied to the FIFO circuit 40.

The data input/output terminals DQ are terminals for outputting read data DQ and inputting write data DQ and are connected to the input and output circuit 41. The input and output circuit 41 is connected to the FIFO circuit 40. In a read operation, a plurality of read data DQ prefetched from the memory cell array 35 to the FIFO circuit 40 is outputted in a burst manner from the data input/output terminals DQ via the input and output circuit 41. In a write operation, a plurality of write data DQ inputted in a burst manner to the data input/output terminal DQ is prefetched to the FIFO circuit 40 via the input and output circuit 41 and is written in the memory cell array 35 simultaneously.

The power supply terminals VDD and VSS are supplied with external voltages VDD and VSS, respectively, and are connected to an internal power supply generation circuit 50. The internal power supply generation circuit 50 generates power supply voltages (voltage VPERI, for example) necessary in the semiconductor device 100 from the external voltages VDD and VSS and supplies these voltages to various units.

An overall configuration of the semiconductor device 100 according to the first exemplary embodiment has thus been described. The semiconductor device 100 adopts power gating to reduce power consumption and subthreshold current in a standby state. In the first exemplary embodiment, power gating is implemented on column decoders 92a and 92b in FIG. 3. Hereinafter, a configuration of the column decoders 92a to 92b will be described.

Figure 4:
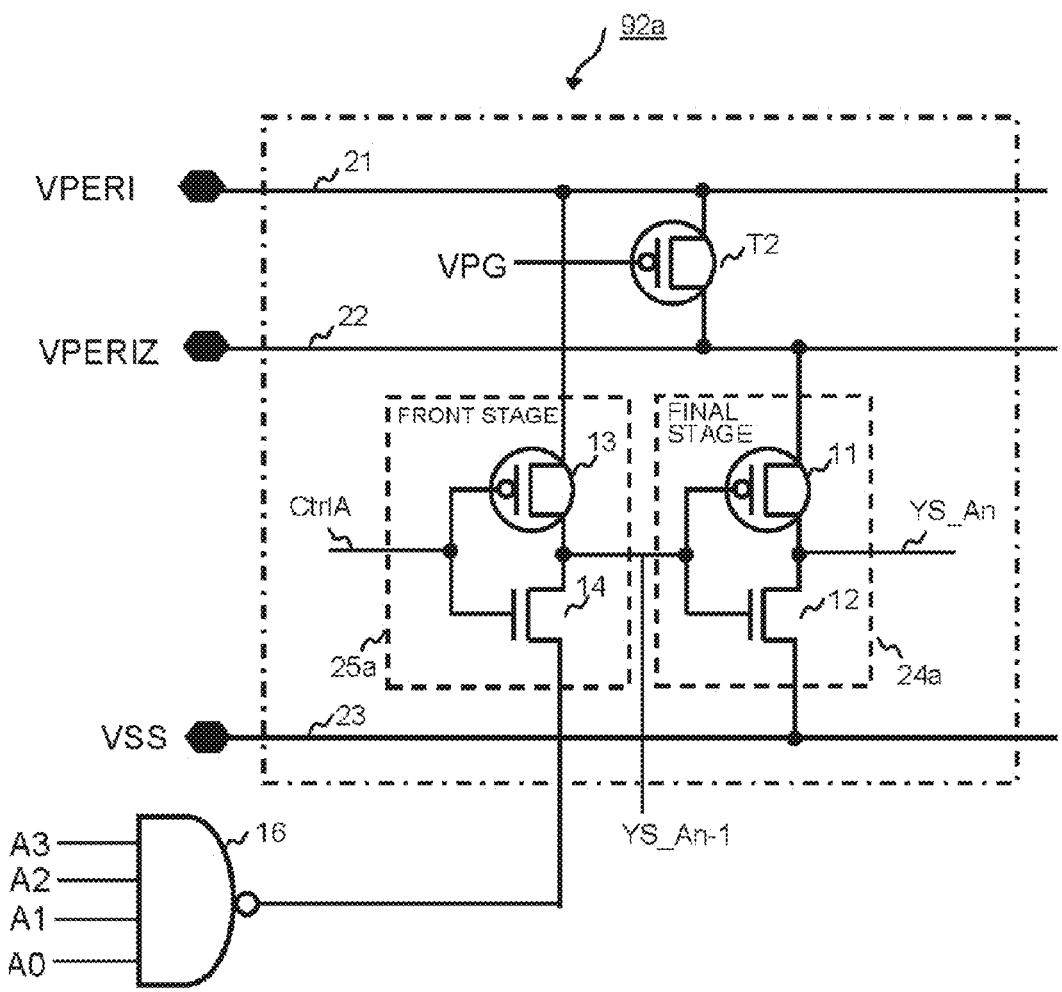
FIG. 4 is an equivalent circuit diagram illustrating a schematic configuration of a column decoder in the semiconductor device according to the first exemplary embodiment.

FIG. 4 is an equivalent circuit diagram illustrating a schematic configuration of the column decoder 92a in the semiconductor device 100 according to the first exemplary embodiment.

The column decoder 92a illustrated in FIG. 4 is a 4-input 16-output column decoder. However, the number of input signals of and the number of output signals of the column decoder are not limited to the above example. The column decoder 92a may have an arbitrary number of input signals and of output signals. In FIG. 4, the column decoder 92a has a power-gating power supply line configuration including an SCRC driver (second transistor) T2, a main power supply line (first interconnect) 21, and a pseudo-power supply line (second interconnect) 22.

Figure 5:
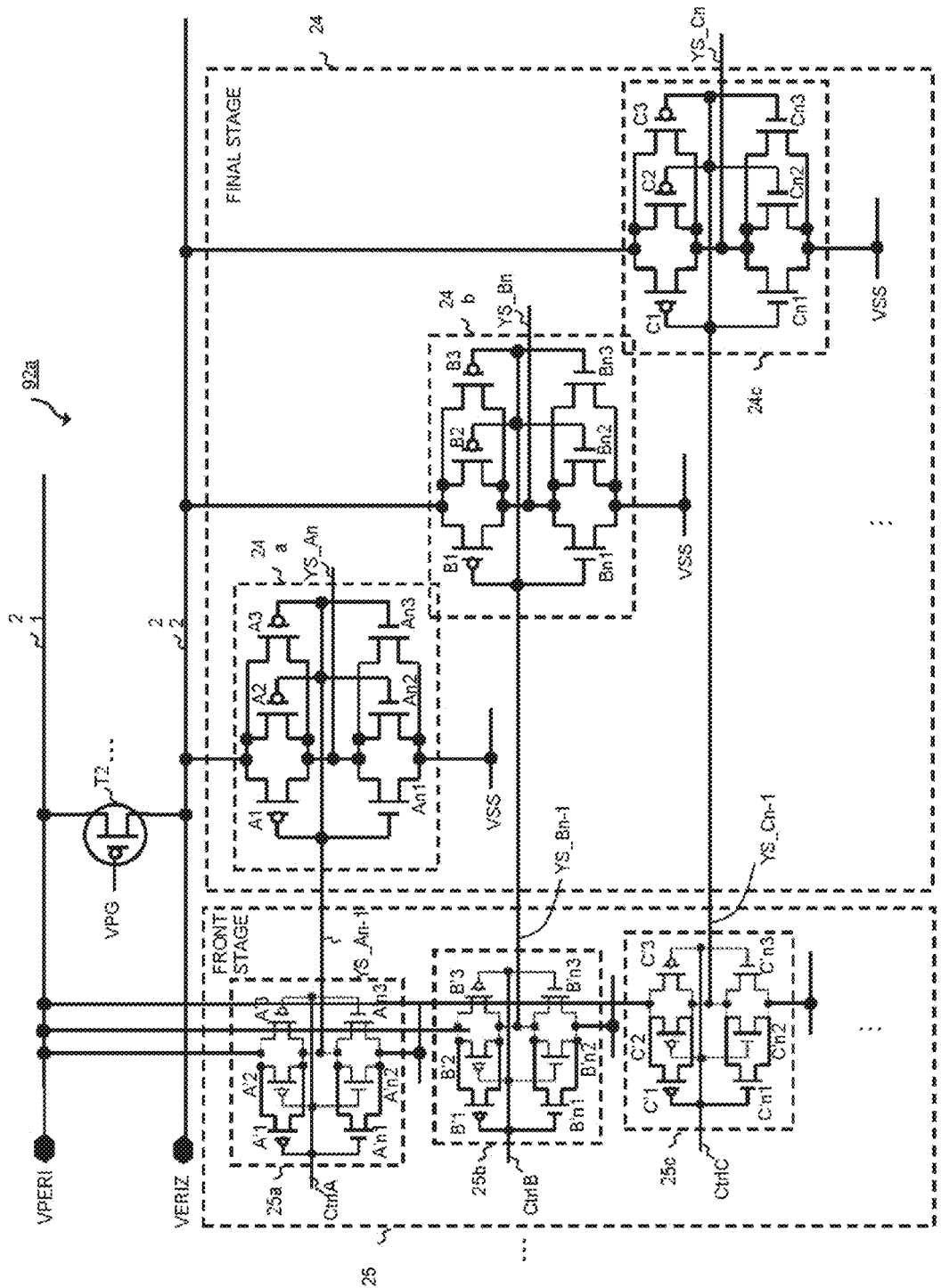
FIG. 5 is an equivalent circuit diagram illustrating a detailed configuration of the column decoder in the semiconductor device according to the first exemplary embodiment.

The column decoder 92a includes 16 channels of decode circuits, each of which includes a NAND circuit 16, a front stage inverter circuit 25a, and a final stage inverter circuit 24a illustrated in FIG. 4. Namely, FIG. 4 only illustrates a decode circuit of one of the 16 channels (three channels are illustrated in FIG. 5 described below).

An input of the column decoder 92a is the above column address, and FIG. 4 illustrates a case in which the column address is four bits (e.g., A3, A2, A1, A0). Each decode circuit has a NAND circuit 16 and the four input terminals thereof input 16 patters signal which is combined with signals A3 or /A3, A2 or /A2, A1 or /A1, and A0 or /A0, respectively. The signals A3, A2, A1, and A0 are input to the decode circuit of channel illustrated in FIG. 4. In this channel, when (A3, A2, A1, A0)=(1, 1, 1, 1), the NAND circuit 16 outputs 0 (low level) and a column selection signal YS_An is activated. In a decode circuit of another channel, if A3, /A2, A1, and /A0 are connected to the input terminals of a corresponding NAND circuit 16, when (A3, A2, A1, A0)=(1, 0, 1, 0), the NAND circuit 16 outputs 0 (low level) and a corresponding column selection signal is activated. Thus, in accordance with 4-bit column address signals A3 to A0, a single column selection signal is selected and activated among the outputs from the 16 channels of decode circuits.

Next, the circuit configuration in FIG. 4 will be described in more detail. The final stage inverter circuit 24a is an inverter circuit including a PMOS transistor (first transistor) 11 and an NMOS transistor 12 that are connected in series with each other between the pseudo-power supply line 22 and a main ground line 23. The column selection signal YS_An is outputted from the connection point of the PMOS transistor 11 and the NMOS transistor 12.

The front stage inverter circuit 25a is an inverter circuit including a PMOS transistor (third transistor) 13 and an NMOS transistor 14 that are connected in series with each other between the main power supply line 21 and the output terminal of the NAND circuit 16. The connection point of the PMOS transistor 13 and the NMOS transistor 14 is connected to an input terminal of the final stage inverter circuit 24a (namely, gates of the PMOS transistor 11 and the NMOS transistor 12). In addition, a control signal CtrlA is input to the input terminal of the front stage inverter circuit 25a (namely, gates of the PMOS transistor 13 and the NMOS transistor 14).

Next, an operation of power gating in FIG. 4 will be described. The power gating control unit (18 in FIG. 3) in the semiconductor device 100 switches a normal operation mode and a standby mode. More specifically, for example, when the power gating control unit (18 in FIG. 3) receives a clock enable signal CKE (not illustrated), if the clock enable signal CKE is in an active state, the power gating control unit sets the normal operation mode. If the clock enable signal CKE is in a non-active state, the power gating control unit sets the standby mode. In this way, in a non-operation state in which no clock is supplied to the semiconductor device 100, the power gating can be set in the standby mode. Note that another signal other than the clock enable signal CKE may be used as the signal for switching the normal operation mode and the standby mode.

When the power gating control unit (18 in FIG. 3) sets the normal operation mode, the power gating control unit (18 in FIG. 3) controls a voltage VPG applied to a second gate electrode of each SCRC driver T2 to a low level to set each SCRC driver T2 in a conductive state. In this way, a power supply potential VPERI of the main power supply line 21 is supplied to the pseudo-power supply line 22. Namely, a potential VPERIZ of the pseudo-power supply line 22 is changed to the potential VPERI.

In addition, in the normal operation mode, when the control signal CtrlA is set to a high level, the NMOS transistor 14 in the front stage inverter circuit 25a turns on, and the output signal of the NAND circuit 16 is outputted as an output signal YS_An−1 of the front stage inverter circuit 25a via the NMOS transistor 14. Next, the logic of the output signal of the NAND circuit 16 is inverted by the final stage inverter circuit 24a, and the signal is outputted as the output signal YS_An (column selection signal) of the column decoder 92a. Next, one of the signals outputted from the 16 channels of decode circuits is activated, and a corresponding signal line is driven.

In contrast, when the power gating control unit (18 in FIG. 3) sets the standby mode, the power gating control unit (18 in FIG. 3) controls the voltage VPG applied to the second gate electrode of each SCRC driver T2 to a high level to set each SCRC driver T2 in a non-conductive state. In such case, since the pseudo-power supply line 22 is separated from the main power supply line 21, the potential VPERIZ of the pseudo-power supply line 22 is set in a floating state. In this standby mode, since no power supply voltage is applied to the PMOS transistor 11, the subthreshold current in the final stage inverter circuit 24a is suppressed, counted as an advantage effect.

In addition, in the standby mode, when the control signal CtrlA is set to a low level, the output signal YS_An−1 of the front stage inverter circuit 25a is fixed at a high level. In this way, while the potential VPERIZ is not supplied to the final stage inverter circuit 24a, the NMOS transistor 12 turns on. As a result, the signal YS_An outputted from the final stage inverter circuit 24a can be maintained at a low level. As described above, by using the configuration in FIG. 4, the subthreshold current can be suppressed and the output signal YS_An can be maintained at a low level in the standby mode.

Next, a detailed configuration of the column decoder 92a in the semiconductor device 100 will be described with reference to FIGS. 5 and 6. FIG. 5 is an equivalent circuit diagram illustrating a detailed configuration of the column decoder 92a in the semiconductor device 100 according to the first exemplary embodiment. FIG. 5 illustrates details of final stage inverter circuits 24a to 24c and front stage inverter circuits 25a to 25c in three decode circuits among the 16 channels of decode circuits.

The control signals inputted to the front stage inverter circuits 25a to 25c are CtrlA, CtrlB, and CtrlC, respectively. As described above, the control signals are set to a high level in the normal operation mode and to a low level in the standby mode. In addition, the output signals of the front stage inverter circuits 25a to 25c are YS_An−1, YS_Bn−1, and YS_Cn−1, respectively. In FIG. 5, the NAND circuit 16 in FIG. 4 is not illustrated.

In addition, the final stage inverter circuits 24a to 24c input the signals YS_An−1, YS_Bn−1, and YS_Cn−1 from the front stage inverter circuits 25a to 25c, respectively. The final stage inverter circuits 24a to 24c invert the logic of the inputted signals and output signals YS_An, YS_Bn, and YS_Cn, respectively. As described above, one of the signals including YS_An, YS_Bn, and YS_Cn outputted from the 16 channels is activated, and a corresponding signal line is driven.

In addition, in the final stage inverter circuits 24a to 24c and the front stage inverter circuits 25a to 25c in FIG. 5, each PMOS transistor and each NMOS transistor is configured with three transistors connected in parallel with each other. More specifically, the PMOS transistors in the final stage inverter circuits 24a to 24c are configured with PMOS transistors A1 to A3 connected in parallel with each other, PMOS transistors B1 to B3 connected in parallel with each other, and PMOS transistors C1 to C3 connected in parallel with each other, respectively. In addition, the NMOS transistors in the final stage inverter circuit 24a to 24c are configured with NMOS transistors An1 to An3 connected in parallel with each other, NMOS transistors Bn1 to Bn3 connected in parallel with each other, and NMOS transistors Cn1 to Cn3 connected in parallel with each other, respectively.

In addition, the PMOS transistors in the front stage inverter circuit 25a to 25c are configured with PMOS transistors A'1 to A'3 connected in parallel with each other, PMOS transistors B'1 to B'3 connected in parallel with each other, and PMOS transistors C'1 to C'3 connected in parallel with each other, respectively. In addition, the NMOS transistors in the front stage inverter circuits 25a to 25c are configured with NMOS transistors A'n1 to A'n3 connected in parallel with each other, NMOS transistors B'n1 to B'n3 connected in parallel with each other, and NMOS transistors C'n1 to C'n3 connected in parallel with each other, respectively.

Figure 6:
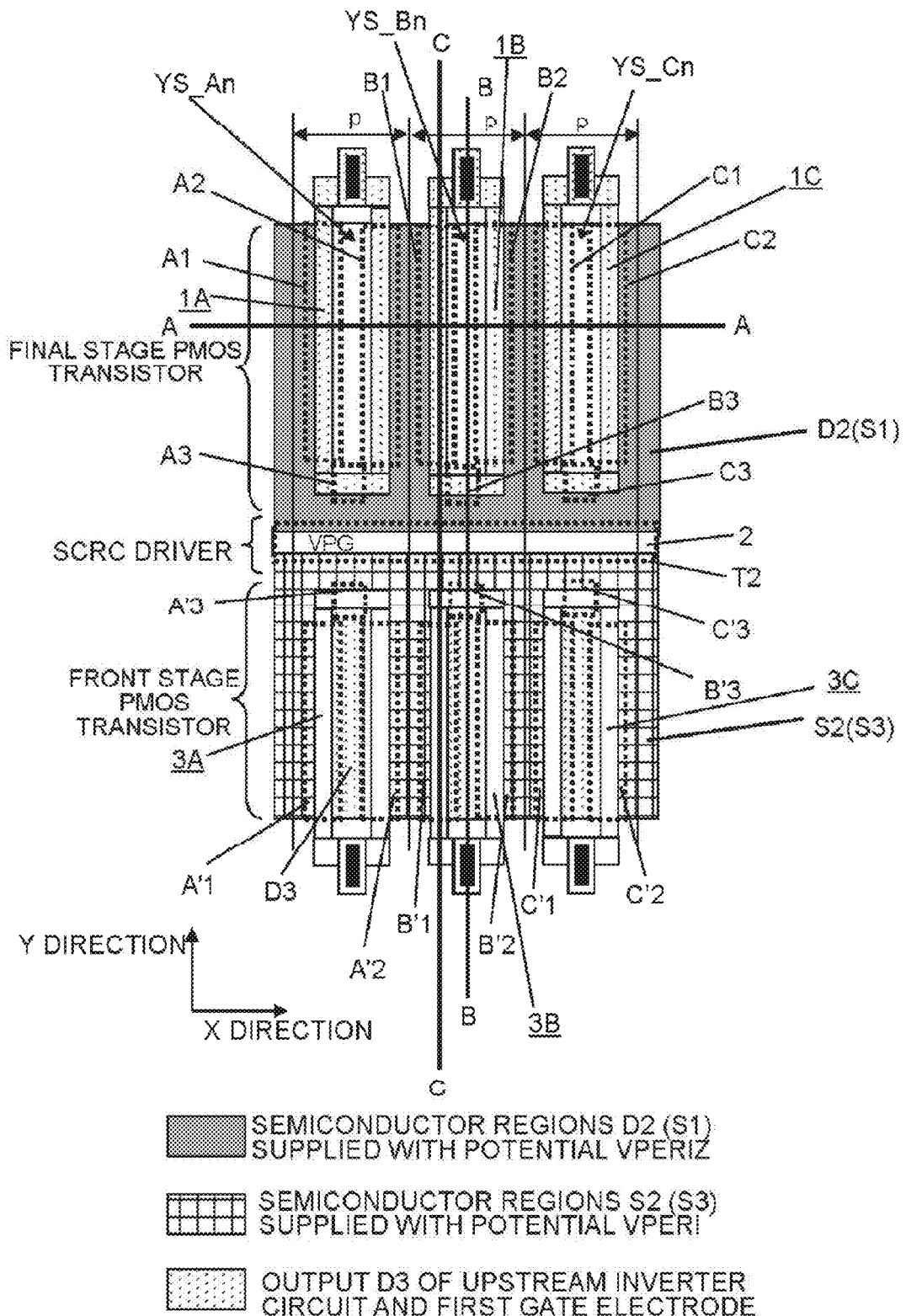
FIG. 6 is a plan view illustrating a layout of a part of the column decoder in the semiconductor device according to the first exemplary embodiment.

FIG. 6 is a plan view illustrating a layout of a part of the equivalent circuit of the column decoder illustrated in FIG. 5. More specifically, FIG. 6 illustrates a layout of PMOS transistors in the equivalent circuit in FIG. 5. When FIG. 6 and FIG. 1 (a diagram referred to in the description of the outline of the exemplary embodiment) are compared, it becomes clear that FIG. 1 and FIG. 6 are different in that, while FIG. 1 illustrates the final stage PMOS transistors of a single channel (PMOS transistors A1 to A3), FIG. 6 illustrates final stage PMOS transistors of a plurality of channels (PMOS transistors A1 to A3, B1 to B3, and C1 to C3) and front stage PMOS transistors of a plurality of channels (PMOS transistors A'1 to A'3, B'1 to B'3, and C'1 to C'3).

In FIG. 6, the second gate electrode 2 of SCRC driver T2 is formed to extend in an X direction. Each SCRC driver T2 has a channel region under the second gate electrode 2. In addition, there are diffusion layers (P+), namely, a source region S2 and a drain region D2, which are separated by the channel region.

Next, a configuration of a final stage PMOS transistor (first transistor) will be described. As illustrated by the equivalent circuit in FIG. 5, a final stage PMOS transistor is configured with three PMOS transistors A1 to A3 connected in parallel with each other. In FIG. 6, regions corresponding to the PMOS transistors A1 to A3 are indicated by dashed lines, respectively.

A first gate electrode 1A of the PMOS transistor A1 to A3 in FIG. 6 has the same configuration as that of the first gate electrode 1 in FIG. 1 and includes a U-shaped portion. As is the case with the first gate electrode 1 in FIG. 1, this U-shaped portion of the first gate electrode 1A includes two parallel electrode portions (corresponding to 1a and 1b in FIG. 1) extending in a Y direction and a connecting electrode portion (corresponding to 1c in FIG. 1) connecting one end of each of the parallel electrode portions.

As illustrated in FIG. 6, a shared diffusion layer (region indicated by D2(S1) in FIG. 6) serves as the drain region D2 of each SCRC driver T2 and a source region S1 of the PMOS transistors A1 to A3. In addition, a diffusion layer (not illustrated) serving as a drain region D1 of the PMOS transistors A1 to A3 is separated from the diffusion layer serving as the source region S1 by a channel region under the first gate electrode 1A and is formed on the inner side of the first gate electrode 1A.

By this configuration as described above, the PMOS transistors A1 to A3 are formed in parallel connection with each other. In addition, the PMOS transistors B1 to B3 and C1 to C3 having the same configuration as that of the PMOS transistors A1 to A3 are sequentially formed side by side at intervals of p in the X direction. FIG. 6 illustrates only three final stage PMOS transistors (A1 to A3, B1 to B3, and C1 to C3). However, in the case of a 4-input 16-output column decoder, 16 final stage PMOS transistors are formed side by side in the X direction. The final stage PMOS transistors output the column selection signals (YS_An, YS_Bn, YS_Cn, etc. in FIG. 5) from the drain regions D1, respectively.

While not illustrated in FIG. 6, the source region S2 of each SCRC driver T2 is connected to the main power supply line 21, to which the power supply potential VPERI is applied, via a contact or the like. In addition, the drain region D2 of each SCRC driver T2 is connected to the pseudo-power supply line 22. The power supply potential VPERIZ is applied to the pseudo-power supply line 22. Connected in this way, as illustrated in FIG. 6, the source region S2 is supplied with the main power supply potential VPERI and the drain region D2 and the source region S1 are supplied with the pseudo-power supply potential VPERIZ.

In the standby mode, since SCRC driver T2 is set in a non-conductive state and the pseudo-power supply line 22 is set in a floating state, the final stage PMOS transistors are not supplied with power. In contrast, in the normal operation mode, SCRC driver T2 is set in a conductive state and the pseudo-power supply line 22 is supplied with the power supply potential VPERI of the main power supply line 21 (namely, the potential is changed from the pseudo-power supply potential VPERIZ to the main power supply potential VPERI). In this way, the source region S1 of the final stage PMOS transistors (A1 to A3, B1 to B3, and C1 to C3) is supplied with the pseudo-power supply potential VPERIZ (equivalent to the main power supply potential VPERI).

As illustrated in FIG. 6, by using a shared diffusion layer serving as the drain region D2 of each SCRC driver T2 and the source region S1 of the final stage PMOS transistors (A1 to A3, B1 to B3, and C1 to C3), the need for interconnects, which would otherwise be necessary between the drain region D2 and the source region S1, can be eliminated. Thus, in power gating that uses the SCRC drivers T2, the interconnect resistance can be reduced.

Next, a configuration of the front stage PMOS transistors A'1 to A'3 in FIG. 6 will be described. The front stage PMOS transistors A'1 to A'3 have the same configuration as that of the final stage PMOS transistors A'1 to A'3. The front stage PMOS transistors A'1 to A'3 and the final stage PMOS transistors A'1 to A'3 are arranged symmetrically (mirror arrangement) with respect to the second gate electrode 2. The front stage PMOS transistors A'1 to A'3 have a third gate electrode 3A.

As illustrated in FIG. 6, a shared diffusion layer (region indicated by S2(S3) in FIG. 6) serves as the source region S2 of each SCRC driver T2 and a source region S3 of the front stage PMOS transistors A'1 to A'3. In addition, a diffusion layer serving as a drain region D3 of the front stage PMOS transistors A'1 to A'3 is separated from the diffusion layer serving as the source region S3 by a channel region under the third gate electrode 3A and is formed on the inner side of the third gate electrode 3A.

In addition, the PMOS transistors B'1 to B'3 and C'1 to C'3 having the same configuration as that of the PMOS transistors A'1 to A'3 are sequentially formed side by side at intervals of p in the X direction. FIG. 6 illustrates only three final stage PMOS transistors (A'1 to A'3, B'1 to B'3, and C'1 to C'3). However, in the case of a 4-input 16-output column decoder, 16 front stage PMOS transistors are formed side by side in the X direction.

As illustrated in FIG. 6, by using a shared diffusion layer serving as the source region S2 of each SCRC driver T2 and the source region S3 of the front stage PMOS transistors (A'1 to A'3, B'1 to B'3, and C'1 to C'3), the need for interconnects, which would otherwise be necessary between the source region S2 and the source region S3, can be eliminated. Thus, in power gating that uses the SCRC drivers T2, the interconnect resistance can be reduced further.

Next, configurations of the SCRC drivers T2, the final stage PMOS transistors, and the front stage PMOS transistors in FIG. 6 will be described in more detail with reference to FIGS. 7A to 7C.

FIGS. 7A to 7C are cross sections taken along lines A-A, B-B, and C-C in FIG. 6, respectively. As illustrated in FIGS. 7A and 7B, an N well (N−) 52 is formed on a P-type Si substrate (P−) 51, and the SCRC drivers T2, the final stage PMOS transistors, and the front stage PMOS transistors described with reference to FIG. 6 are formed in the N well (N−) 52. In FIG. 7A, cross sections of the parallel electrode portions of the U-shaped first gate electrodes 1A to 1C are illustrated. As illustrated in FIG. 7A, gate insulating films 53 are formed on top of respective channel regions 54, each of which separates the corresponding source region S1 and drain region D1. In addition, the first gate electrodes 1A to 1C made of polysilicon or the like are formed on top of the respective gate insulating films 53.

The B-B cross section in FIG. 7B illustrates the drain region D3 of the front stage PMOS transistors B'1 to B'3, the connecting electrode portion of the third gate electrode 3B, the source region S3 of the front stage PMOS transistors B'1 to B'3, the second gate electrode 2, the source region S1 of the final stage PMOS transistors B1 to B3, the connecting electrode portion of the first gate electrode 1B, and the drain region D1 of the final stage PMOS transistors B1 to B3.

The C-C cross section in FIG. 7C illustrates the parallel electrode portion of the third gate electrode 3B, the source region S3 of the front stage PMOS transistor B'1 to B'3, the second gate electrode 2, the source region S1 of the final stage PMOS transistors B1 to B3, and the parallel electrode portion of the first gate electrode 1B.

In addition, as illustrated in FIGS. 7B and 7C, STIs (Shallow Trench Isolations) 68a and 68b are arranged as insulating regions for element isolation at the bottom of the front stage PMOS transistors and on top of the final stage PMOS transistors, respectively.

Figure 8:
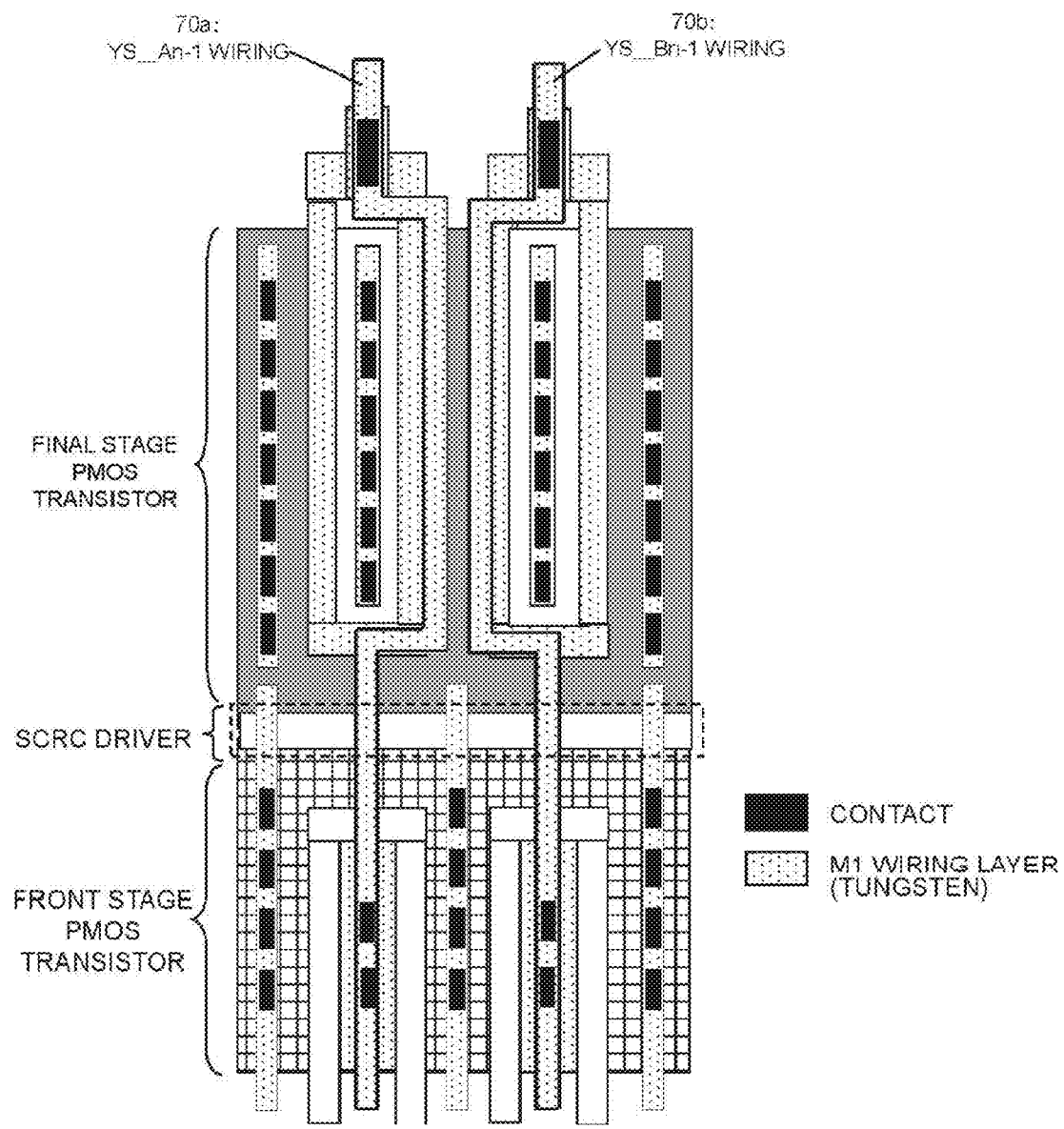
FIG. 8 illustrates contacts and an M1 interconnect layer of the column decoder in the semiconductor device according to the first exemplary embodiment.

Next, interconnects for SCRC drivers T2, the final stage PMOS transistors, and the front stage PMOS transistors in FIG. 6 will be described with reference to FIG. 8. FIG. 8 illustrates contacts and an M1 interconnect layer of the column decoder 92a. As illustrated in FIG. 8, the source regions and the drain regions of the SCRC drivers T2, the final stage PMOS transistors, and the front stage PMOS transistors are connected to M1 interconnect layers made of tungsten via contacts.

In addition, as illustrated by the equivalent circuit in FIG. 5, the drain region D3 of each of the front stage PMOS transistors is connected to the first gate electrode (1A to 1C in FIG. 6) of a corresponding one of the final stage PMOS transistors. As illustrated in FIG. 8, these connections are made by the M1 interconnect layer via contacts (a YS_An−1 interconnect 70a and a YS_Bn−1 interconnect 70b in FIG. 8; each corresponding to the above first intermediate interconnect).

Figure 9:
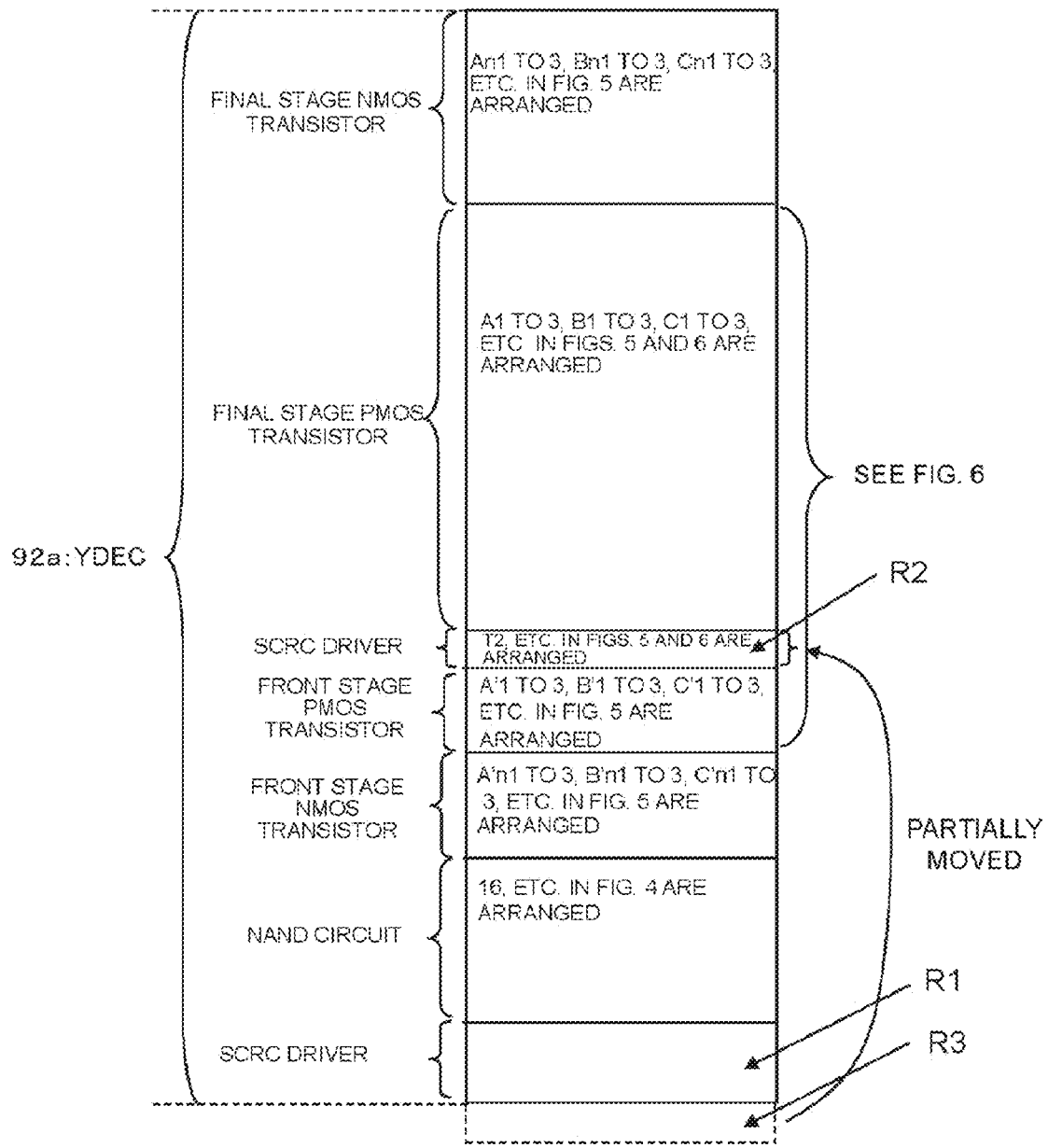
FIG. 9 is an overall layout diagram of the column decoder in the semiconductor device according to the first exemplary embodiment.

Next, an overall layout of the column decoder 92a will be described with reference to FIG. 9. FIG. 9 is an overall layout diagram of the column decoder 92a in the semiconductor device 100. In FIG. 9, the final stage PMOS transistors, the SCRC drivers, and the front stage PMOS transistors, which are in the second to fourth regions from the top, correspond to the regions described with reference to FIG. 6. Since these regions have already been described, description thereof will be omitted.

Regions other than these regions will be described with reference to FIG. 9. As illustrated in FIG. 9, the final stage NMOS transistors (An1 to An3, Bn1 to Bn3, and Cn1 to Cn3 in FIG. 5) are arranged at the top. As described above, an STI (68b in FIG. 7) is formed between the region including the final stage NMOS transistors and the region including the final stage PMOS transistors.

In addition, as illustrated in FIG. 9, the front stage NMOS transistors (A'n1 to A'n3, B'n1 to B'n3, and C'n1 to C'n3 in FIG. 5) are arranged under the region of the front stage PMOS transistors. In addition, as described above, an STI (68a in FIG. 7) is arranged between the region including the front stage PMOS transistors and the region including the front stage NMOS transistors.

In addition, NAND circuits (16 in FIG. 4) are arranged under the front stage NMOS transistors. The SCRC drivers (indicated by R1) are arranged at the bottom. When the present exemplary embodiment is not applied, the SCRC drivers are arranged at the bottom (at a layout position R1). When the present exemplary embodiment is applied, all the SCRC drivers at the bottom region can be moved to an SCRC driver layout position R2 in which "T2, etc. in FIGS. 5 and 6 are arranged" is indicated (to a region between the region including the final stage PMOS transistors and the region including the front stage PMOS transistors).

If all the SCRC drivers cannot be moved because of layout design, at least one of the SCRC drivers can be moved from the position R1 to the position R2. In such cases, remaining SCRC drivers are left in the original region R1.

FIG. 9 illustrates a case where some SCRC drivers described above have been moved. In FIG. 9, a frame R3 indicated by a dashed line indicates the SCRC drivers that have been moved. Namely, as illustrated in FIG. 9, the overall layout area of the column decoder 92a is reduced (the layout area corresponding to the region R3 is reduced), counted as an advantageous effect.

Figure 10:
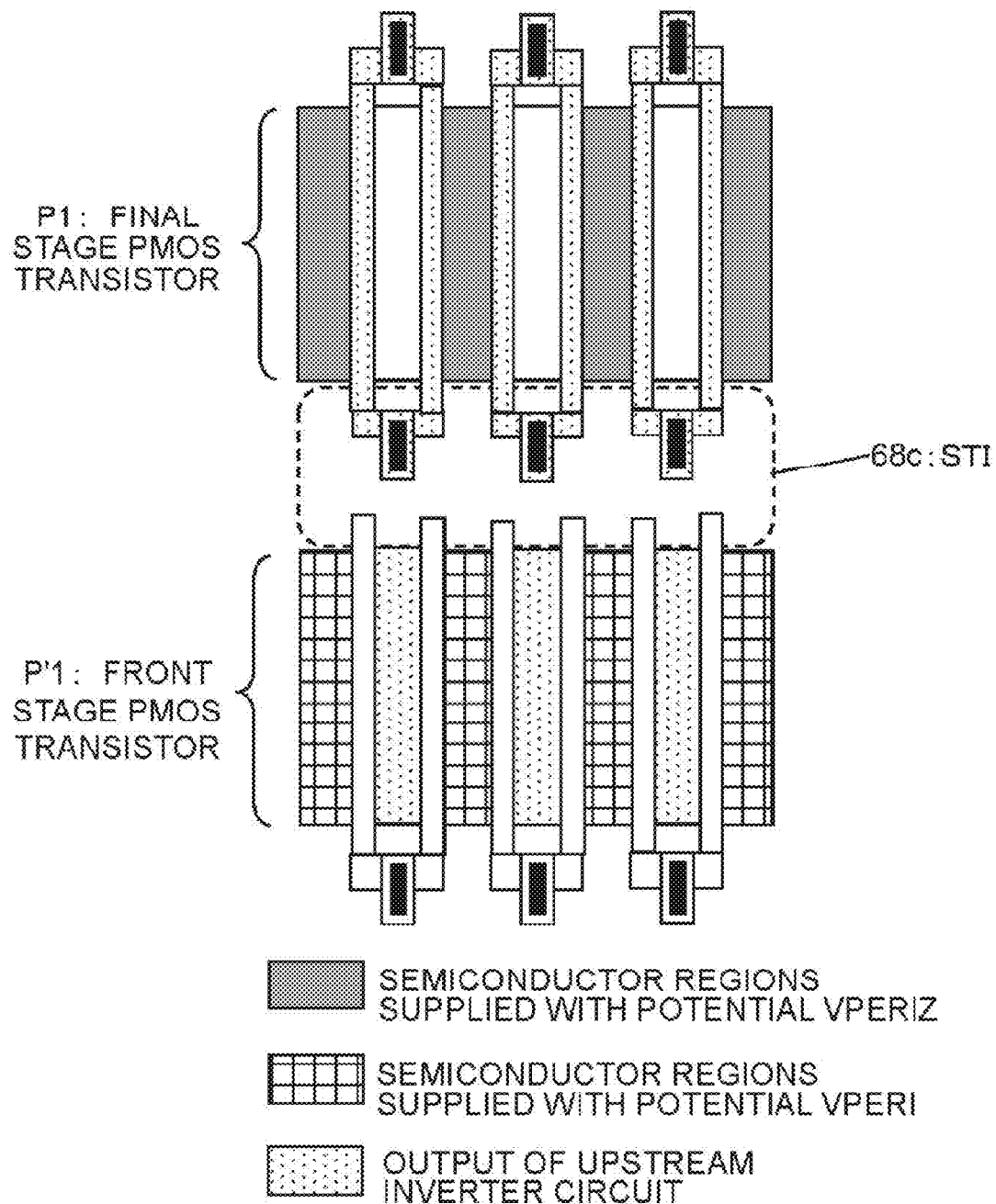
FIG. 10 is a plan view illustrating a layout of a part of a column decoder in a semiconductor device according to comparative example 1.

Next, in comparison to the first exemplary embodiment, related comparative example 1 will be described. FIG. 10 is a plan view illustrating a layout of a part of a column decoder in a semiconductor device according to comparative example 1. In FIG. 10, an STI 68c is arranged between the final stage PMOS transistors P1 and the front stage PMOS transistors P'1, and those transistors are electrically isolated from each other. In addition, no SCRC driver shares diffusion layers serving as source and drain regions with the final stage PMOS transistors P1 and the front stage PMOS transistor P'1. SCRC drivers are arranged in a different region (see FIG. 12).

Next, the interconnect resistance of the SCRC drivers, according to comparative example 1, will be described with reference to FIGS. 11A to 11C. FIGS. 11A to 11C are diagrams for illustrating the interconnect resistance of the column decoder in the semiconductor device according to comparative example 1. FIG. 11A illustrates a configuration of a memory cell array in the semiconductor device. As illustrated in FIG. 11A, column decoders 82a and 82b are arranged near memory regions 90a and 90b, respectively.

FIG. 11B illustrates a configuration of MOS transistors and interconnect layers formed on the semiconductor substrate of the column decoder 82a. As illustrated in FIG. 11B, the final stage PMOS transistors P1 and the front stage PMOS transistors P'1 are arranged. As illustrated in FIG. 11C, each PMOS transistor has a source region S and a drain region D that are separated by a channel region under each of two gate electrodes G.

As illustrated in FIG. 11B, SCRC drivers T'2 are formed at positions away from the final stage PMOS transistors P1 and the front stage PMOS transistors P'1. Interconnects of an M2 interconnect layer are used to electrically connect the source region S2 of the final stage PMOS transistors P1 and the drain region D1 of the SCRC drivers T'2.

In FIG. 11B, interconnects connecting the source region S1 of the final stage PMOS transistors P1 and the drain region D2 of the SCRC drivers T'2 have M2 resistance 94a to 94c. The larger the interconnect resistance of the M2 resistance 94a to 94c is, the more likely waveform distortion is caused in the power supply potentials of the main power supply line 21 and the pseudo-power supply line 22, imposing a limit on improvement of the operation speed.

Figure 12:
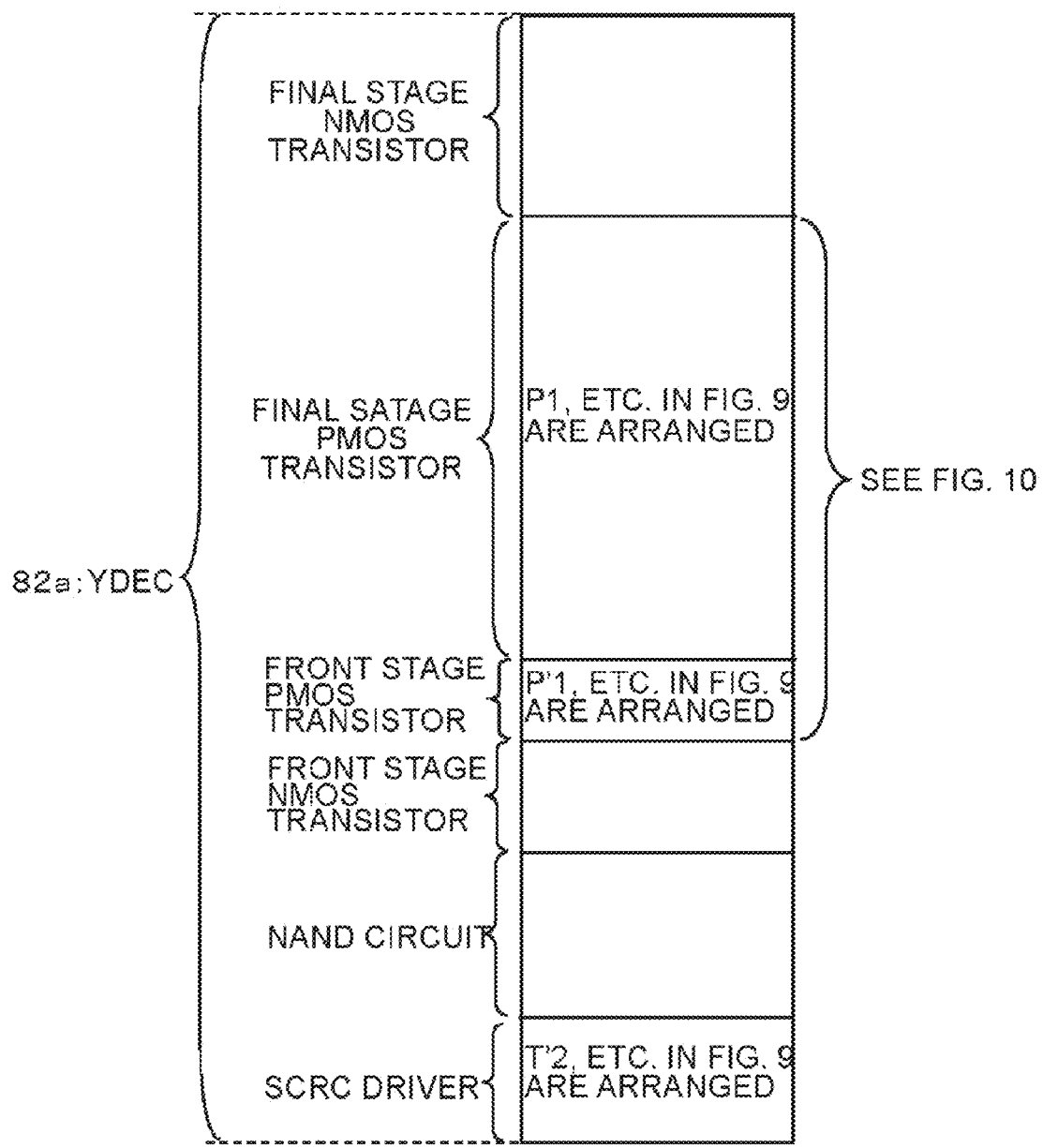
FIG. 12 is an overall layout diagram of the column decoder in the semiconductor device according to comparative example 1.

Next, an overall layout of the column decoder 82a according to comparative example 1 will be described with reference to FIG. 12. FIG. 12 is an overall layout diagram of the column decoder 82a according to comparative example 1. As illustrated in FIG. 12, the final stage PMOS transistors and the front stage PMOS transistors, which are in the second and third regions from the top, correspond to the regions described with reference to FIG. 10. Since these regions have already been described, description thereof will be omitted.

Regarding regions other than the above regions, FIG. 12 differs from FIG. 9 (the first exemplary embodiment) in that all SCRC drivers are arranged away from the final stage PMOS transistors and the front stage PMOS transistor in FIG. 12. Thus, as described above, the M2 resistance 94a to 94c exists between the source region S1 of the final stage PMOS transistors P1 and the drain region D2 of the SCRC drivers T'2.

Next, advantageous effects of the first exemplary embodiment will be described by comparing the first exemplary embodiment with comparative example 1. According to the first exemplary embodiment, by using a shared diffusion layer serving as the drain region D2 of the SCRC drivers T2 and the source region S1 of the final stage PMOS transistors (A1 to A3, B1 to B3, C1 to C3), there is no need to arrange any interconnects between the drain region D2 and the source region S1. In addition, according to the first exemplary embodiment, by using a shared diffusion layer serving as the source region S2 of the SCRC drivers T2 and the source region S3 of the front stage PMOS transistors (A'1 to A'3, B'1 to B'3, and C'1 to C'3), there is no need to arrange any interconnects between the source region S2 and the source region S3. Thus, since no interconnect connected to the source and drain regions of the SCRC drivers T2 is needed, the interconnect resistance in power gating can be reduced, counted as an advantageous effect.

According to comparative example 1, because of the interconnect resistance (M2 resistance 94a to 94c, etc.) between the SCRC drivers T'2 and the final stage PMOS transistors P1, waveform distortion can be created in the power supply potentials of the main power supply line 21 and the pseudo-power supply line 22, imposing a limit on improvement of the operation speed. However, according to the first exemplary embodiment, since the interconnect resistance is reduced, this problem can be reduced or eliminated.

In addition, in the semiconductor device disclosed in the '272 patent, the functional circuit region and the driver region are separated (see FIG. 3 in the '272 patent). Thus, regarding a circuit cell in the functional circuit region that is arranged away from the driver region, since the distance between the circuit cell and a SCRC driver is long, the interconnect resistance cannot sufficiently be suppressed. Thus, because of the interconnect resistance, waveform distortion can be caused in the voltages of the power supply line and the ground line, imposing a limit on improvement of the speed of a circuit operation in the semiconductor device. In contrast, according to the first exemplary embodiment, since the interconnect resistance is reduced, this problem can be reduced or eliminated.

In addition, according to the first exemplary embodiment, as illustrated in FIG. 9, by moving the SCRC drivers to a region between the final stage PMOS transistors and the front stage PMOS transistors, the layout area can be reduced. In addition, while an insulating region, namely, the STI 68c (FIG. 10), is needed according to comparative example 1, since the SCRC drivers T2 are arranged in that region according to the first exemplary embodiment, the STI 68c is not needed. As a result, the layout area can be reduced. Therefore, the column decoder can have an overall layout area that is smaller than that of the column decoder according to comparative example 1, counted as an advantageous effect.

Figure 13:
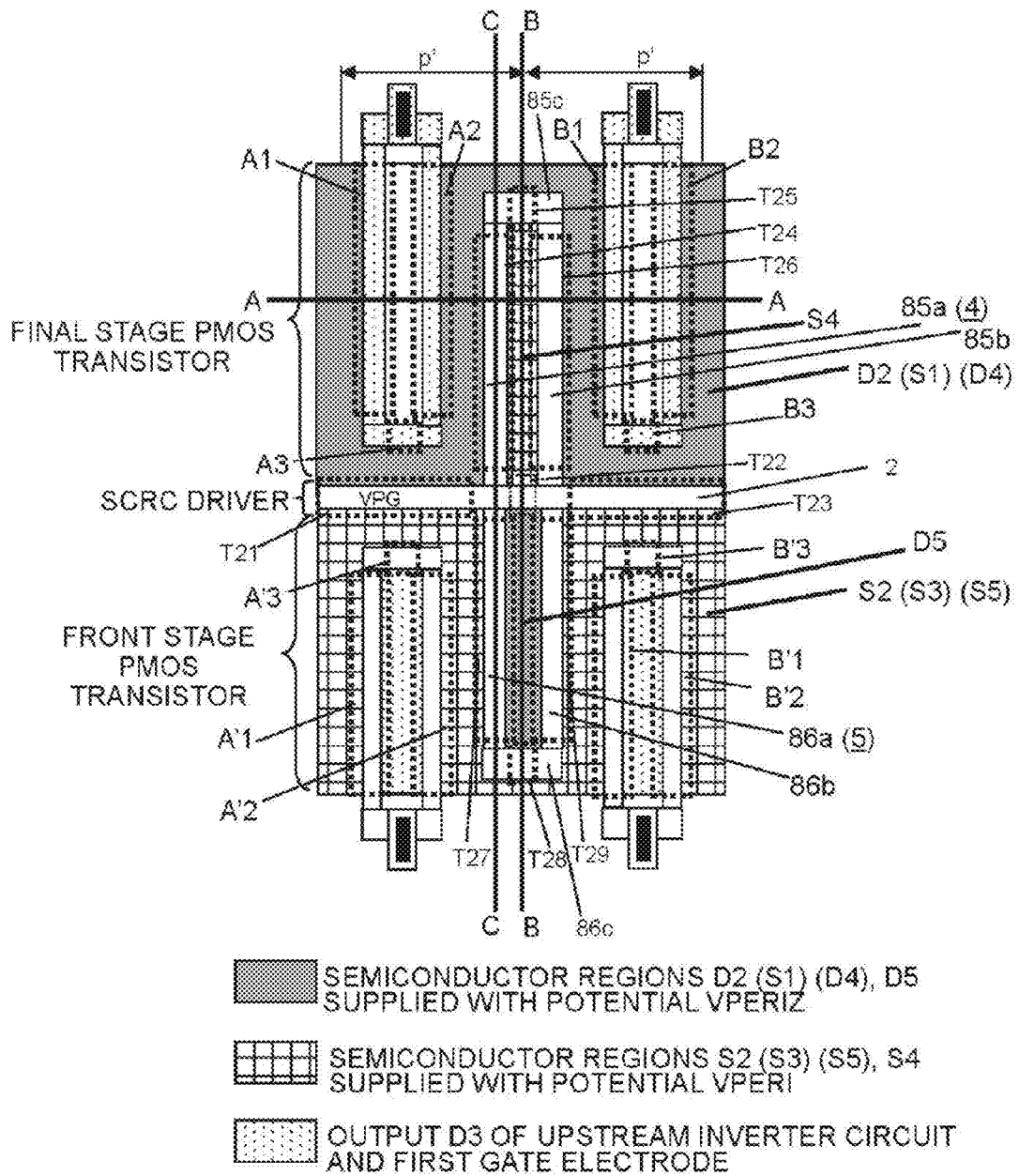
FIG. 13 is a plan view illustrating a layout of a part of a column decoder in a semiconductor device according to a second exemplary embodiment.

Next, a second exemplary embodiment will be described with reference to FIG. 13 and FIGS. 14A to 14C. FIG. 13 is a plan view illustrating a layout of an SCRC driver T2, final stage PMOS transistors, and front stage PMOS transistors of a column decoder in a semiconductor device according to a second exemplary embodiment. When FIG. 13 and FIG. 6 (the first exemplary embodiment) are compared, it becomes clear that PMOS transistors (fourth transistors) T24 to T26 and PMOS transistors (fifth transistors) T27 to T29 are added to an SCRC driver (second transistor) T2 in FIG. 13. As illustrated in FIG. 13, the gates of these transistors include straight portions (gates of transistors T21 and T23), a ring-like portion having four sides (gate of a transistor T22 and gates of the transistors T24 to T26), and a ring-like portion having four sides one of which shares a gate of the transistor T22 (gate of the transistor T22 and gates of the transistors T27 to T29). In addition, an SCRC driver (second transistor) T2 according to the first exemplary embodiment is formed by three divided PMOS transistors T21 to T23.

Configured in this way, according to the second exemplary embodiment, the drive capability of the SCRC drivers arranged between the final stage PMOS transistors and the front stage PMOS transistors can be improved further, as compared with that according to the first exemplary embodiment. Namely, more SCRC drivers can be moved from the SCRC driver region at the bottom in FIG. 9.

Next, the PMOS transistors (fourth transistors) T24 to T26 in FIG. 13 will be described in more detail. A fourth gate electrode 4 of the PMOS transistors T24 to T26 has a U-shaped portion including two parallel electrode portions 85a and 85b and a connecting electrode portion 85c connected to one end of each of the parallel electrode portions, as is the case with the first gate electrodes 1A to 1C and the third gate electrodes 3A to 3C. The other end of each of the two parallel electrode portions 85a and 85b is connected to and integrally formed with the second gate electrode 2.

In addition, diffusion layers, which are a source region S4 and a drain region D4, are separated by a channel region under the fourth gate electrode 4. Here, the drain region D4 is a shared diffusion layer which also serves as the drain region D2 and the source region S1 (the region indicated by D2(S1) (D4) in FIG. 13). On the other hand, the source region S4 is separated from the diffusion layer serving as the drain region D4 by the channel region under the fourth gate electrode 4 and is formed on the inner side of the fourth gate electrode 4. In addition, the main power supply line 21 having the power supply potential VPERI is connected to the source region S4.

Next, the PMOS transistors (fifth transistors) T27 to T29 in FIG. 13 will be described in detail. As is the case with the fourth gate electrode 4, a fifth gate electrode 5 of the PMOS transistors T27 to T29 has a U-shaped portion including two parallel electrode portions 86a and 86b and a connecting electrode portion 86c connected to one end of each of the parallel electrode portions. The other end of each of the two parallel electrode portions 86a and 86b is connected to and integrally formed with the second gate electrode 2.

In addition, diffusion layers, which are a source region S5 and a drain region D5, are separated by a channel region under the fifth gate electrode 5. Here, the source region S5 is a shared diffusion layer which also serves as the source region S2 and the source region S3 (the region indicated by S2(S3) (S5) in FIG. 13). On the other hand, the drain region D5 is separated from the diffusion layer serving as the source region S5 by the channel region under the fifth gate electrode 5 and is formed on the inner side of the fifth gate electrode 5. In addition, the pseudo-power supply line 22 is connected to the drain region D5.

Each SCRC driver is configured with PMOS transistors of nine regions, namely, the second transistors (T21 to 23), the fourth transistors (T24 to T26), and the fifth transistors (T27 to T29).

FIG. 13 illustrates only the two final stage PMOS transistors (A1 to A3 and B1 to B3) and the two front stage PMOS transistors (A'1 to A'3 and B'1 to B'3). However, in the case of a 4-input 16-output column decoder, 16 final stage PMOS transistors are formed side by side in the X direction. PMOS transistors (fourth transistors) are formed between two sets of final stage PMOS transistors. In addition, PMOS transistors (fifth transistor) are formed between two sets of front stage PMOS transistors.

Next, configurations of the SCRC driver, the final stage PMOS transistors, and the front stage PMOS transistors in FIG. 13 will be described further with reference to FIG. 14. FIGS. 14A to 14C are cross sections taken along lines A-A, B-B, and C-C in FIG. 13, respectively. When FIG. 14A is compared with FIG. 7A (the first exemplary embodiment), it becomes clear that FIG. 14A differs from FIG. 7A in that the two parallel electrode portions of the fourth gate electrode 4 are arranged in the middle in FIG. 14A and the source region S4 is arranged between the two parallel electrode portions.

The B-B cross section in FIG. 14B illustrates the source region S3 of the front stage PMOS transistors, the connecting electrode portion 86c of the fifth gate electrode 5, the drain region D5 of the PMOS transistors T27 to T29, the second gate electrode 2, the source region S4 of the PMOS transistors T24 to T26, the connecting electrode portion 85c of the fourth gate electrode 4, and the source region S1 of the final stage PMOS transistors.

The C-C cross section in FIG. 14C illustrates the source region S3 of the front stage PMOS transistors, the gate electrode (a parallel electrode portion of the fifth gate electrode 5, the second gate electrode 2, the parallel electrode portion of the fourth gate electrode 4), and the source region S1 of the final stage PMOS transistors.

According to the second exemplary embodiment, as illustrated in FIG. 8 (the first exemplary embodiment), the drain region D3 of each of the front stage PMOS transistors is connected to the first gate electrode (1A and 1B) of a corresponding one of the final stage PMOS transistors (corresponding to the above first intermediate interconnect).

As described above, according to the second exemplary embodiment, in addition to the advantageous effects of the first exemplary embodiment, the drive capability of the SCRC drivers arranged between the final stage PMOS transistors and the front stage PMOS transistors can be improved, counted as an advantageous effect.

Next, a third exemplary embodiment will be described with reference to FIGS. 15 to 18. According to the third exemplary embodiment, power gating is applied to a peripheral circuit other than the column decoders in the semiconductor device 100.

Figure 15:
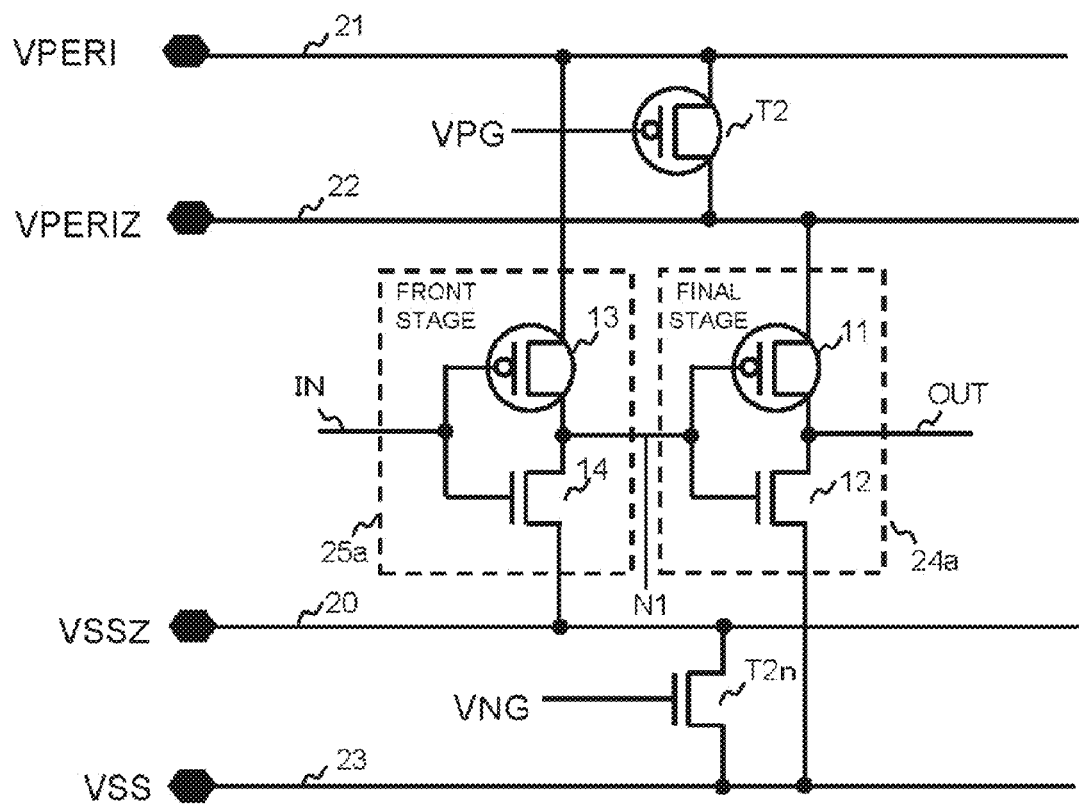
FIG. 15 is an equivalent circuit diagram illustrating a schematic configuration of a peripheral circuit in a semiconductor device according to a third exemplary embodiment.

FIG. 15 illustrates an equivalent circuit of a peripheral circuit. When FIG. 15 is compared with FIG. 4 (the first exemplary embodiment), it becomes clear that the third exemplary embodiment differs from the first exemplary embodiment in the following points. In FIG. 15, a pseudo-ground line 20 (a power supply potential VSSZ) is added and an SCRC driver (NMOS transistor; seventh transistor) T2n is arranged between the pseudo-ground line 20 and the main ground line 23.

When the power gating control unit (18 in FIG. 3) sets the normal operation mode, the power gating control unit (18 in FIG. 3) sets the voltage VPG applied to the second gate electrode 2 of the SCRC driver T2 to a low level to set the SCRC driver T2 in a conductive state. In addition, the power gating control unit (18 in FIG. 3) sets the voltage VNG applied to a seventh gate electrode 7 of the SCRC driver T2n to a high level to set the SCRC driver T2n in a conductive state as well. In this way, the power supply potential VPERI of the main power supply line 21 is supplied to the pseudo-power supply line 22, and the power supply potential VSS of the main ground line 23 is supplied to the pseudo-ground line 20. Namely, the potential VPERIZ of the pseudo-power supply line 22 is changed to the potential VPERI, and the potential VSSZ of the pseudo-ground line 20 is changed to the potential VSS.

When the power gating control unit (18 in FIG. 3) sets the standby mode, the power gating control unit (18 in FIG. 3) sets the voltage VPG applied to the second gate electrode 2 of the SCRC driver T2 to a high level to set the SCRC driver T2 in a non-conductive state. In addition, the power gating control unit (18 in FIG. 3) sets the voltage VNG applied to the seventh gate electrode 7 of the SCRC driver T2n to a low level to set the SCRC driver T2n in a non-conductive state as well. In such case, since the pseudo-power supply line 22 is separated from the main power supply line 21, the potential VPERIZ of the pseudo-power supply line 22 is set in a floating state. In addition, since the pseudo-ground line 20 is separated from the main ground line 23, the potential VSSZ of the pseudo-ground line 20 is also set in a floating state. In the standby mode according to the second exemplary embodiment, since no power supply voltage is supplied to the NMOS transistor 14, not only the subthreshold current flowing through the final stage inverter circuit 24a but also the sub-threshold flowing current through the front stage inverter circuit 25a can be suppressed, counted as an advantageous effect.

In addition, in the standby mode, when an input signal IN is set to a low level, the PMOS transistor 13 and NMOS transistor 12 can be turned on while the pseudo-power supply line 22 and the pseudo-ground line 20 are in a floating state. Namely, an output signal (a potential at a node N1) from the front stage inverter circuit 25a is fixed at a high level. As a result, upon receiving the high-level signal, the final stage inverter circuit 24a can maintain an output signal OUT at a low level. Thus, with the configuration in FIG. 15, the sub-threshold current can be suppressed and the output signal OUT can be maintained at a low level in the standby mode.

Figure 16:
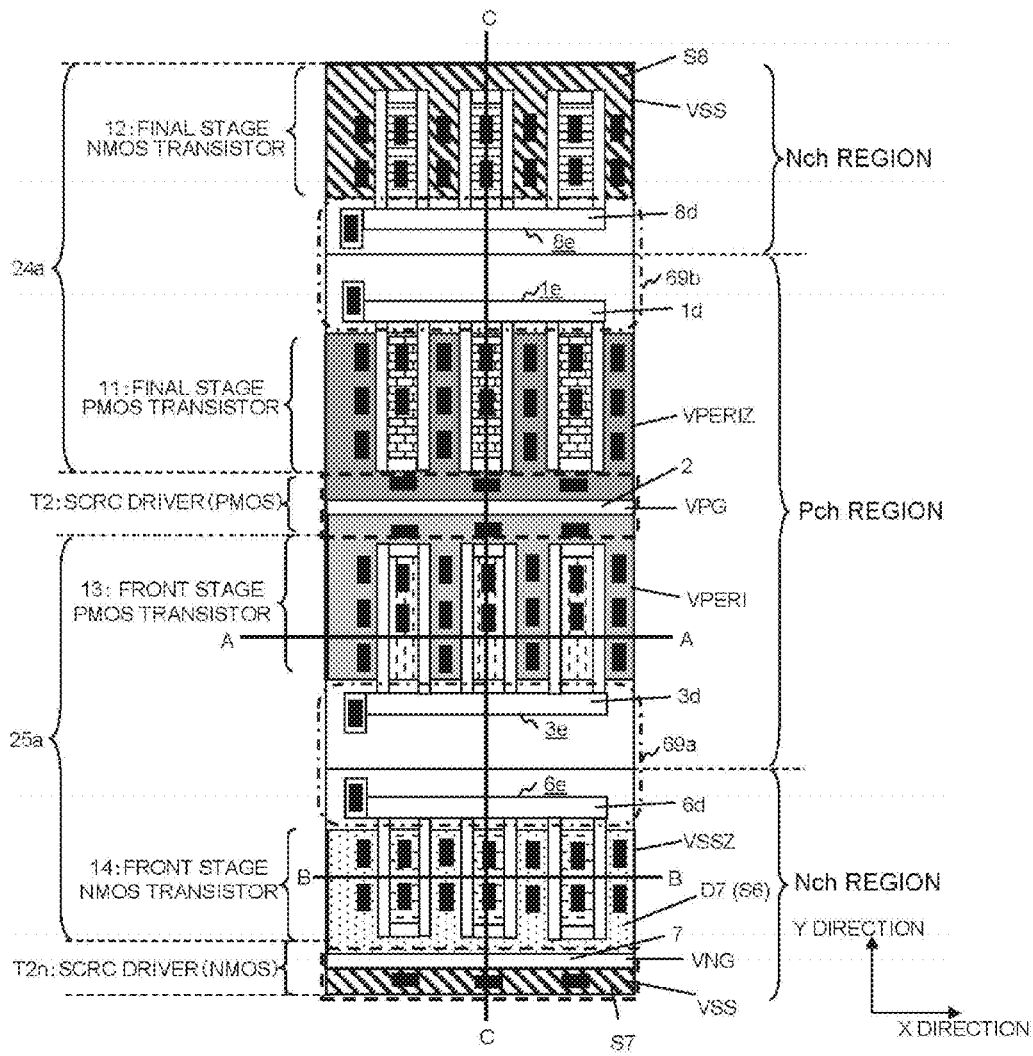
FIG. 16 is a plan view illustrating a layout of the peripheral circuit in the semiconductor device according to the third exemplary embodiment.

Next, a layout of the peripheral circuit in the semiconductor device according to the third exemplary embodiment will be described with reference to FIG. 16. FIG. 16 is a plan view illustrating a layout of the peripheral circuit in the semiconductor device according to the third exemplary embodiment. In FIG. 16, since the portions in the Pch region are the same as those in FIG. 6 (the first exemplary embodiment), redundant description will be omitted. However, in FIG. 16, gate interconnect portions 1d and 3d for electrically connecting a plurality of gate electrodes (1A to 1C, 3A to 3C in FIG. 6) are arranged.

In FIG. 16, the final stage NMOS transistor 12 in an Nch region is arranged on top of the Pch region and the front stage NMOS transistor 14 in an Nch region is arranged at the bottom of the Pch region. In addition, an STI 69b is arranged as an insulating region for element isolation between the final stage PMOS transistor 11 and the final stage NMOS transistor 12. Likewise, an STI 69a is arranged as an insulating region for element isolation between the front stage PMOS transistor 13 and the front stage NMOS transistor 14.

Next, a configuration of the final stage NMOS transistor 12 will be described. An eighth gate electrode 8e is configured by connecting a plurality of U-shaped electrodes at the gate interconnect portion 8d. A source region S8 and a drain region D8 are separated from each other by a channel region under the eighth gate electrode 8e. Each drain region D8 is formed on the inner side of a corresponding U-shaped electrode of the eighth gate electrode 8e. In addition, the main ground line 23 (the power supply potential VSS) is connected to the source region S8.

Next, a configuration of the front stage NMOS transistor 14 (sixth transistor) will be described. A sixth gate electrode 6e has the same configuration as that of the eighth gate electrode 8e. Namely, a plurality of U-shaped electrodes are connected at a gate interconnect portion 6d. A source region S6 and a drain region D6 are separated from each other by a channel region under the sixth gate electrode 6e. Each drain region D6 is formed on the inner side of a corresponding U-shaped electrode of the sixth gate electrode 6e. In addition, the pseudo-ground line 20 is connected to the source region S6.

Next, a configuration of the SCRC driver (NMOS transistor; seventh transistor) T2n will be described. While the SCRC driver T2n has the same configuration as that of the SCRC driver T2, the conductivity type of the SCRC driver T2n is the N type. As illustrated in FIG. 16, the seventh gate electrode 7 is formed to extend in the X direction, and a source region S7 and a drain region D7 are separated from each other by a channel region under the seventh gate electrode 7. In the third exemplary embodiment, the diffusion layer serving as the source and drain regions S7 and D7 is an N-type (N+) diffusion layer.

A shared diffusion layer is used to serve as the drain region D7 and the source region S6 of the front stage NMOS transistor (sixth transistor) 14 (region indicated by D7(S6) in FIG. 16). In addition, the main ground line 23 is connected to source region S7, and the pseudo-ground line 20 is connected to the drain region D7 and the source region S6. By using a shared diffusion layer serving as the drain region D7 of the SCRC driver T2n and as the source region S6 of the front stage NMOS transistor 14, the need for interconnects connecting the drain region D7 of the SCRC driver T2n and the source region S6 of the front stage NMOS transistor 14 can be eliminated. Thus, according to the third exemplary embodiment, in power gating that uses the SCRC driver T2n, the interconnect resistance can be reduced as well.

According to the third exemplary embodiment, the drain region D3 of the front stage PMOS transistor is connected to the first gate electrode (1A, 1B, etc.) of the final stage PMOS transistor (in the same way as illustrated in FIG. 8). The drain region D3 is also connected to the drain region D6 of the front stage NMOS transistor. Such connection interconnect corresponds to the above second intermediate interconnect.

Figure 17:
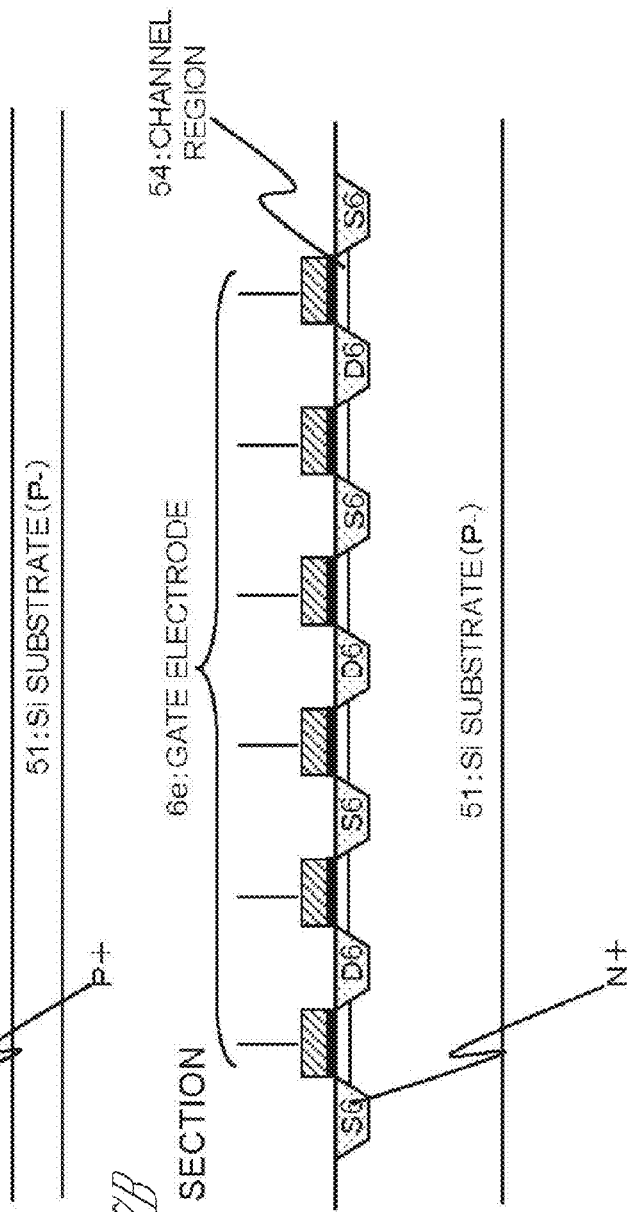
FIGS. 17A and 17B are cross sections taken along lines A-A and B-B in FIG. 16, respectively.

Next, a configuration of the peripheral circuit in the semiconductor device in FIG. 16 will be described further with reference to FIGS. 17 and 18. FIGS. 17A and 17B are cross sections taken along lines A-A and B-B in FIG. 16. FIGS. 17A and 17B and FIG. 7A will be compared with each other. While FIG. 7A is a cross section of the final stage PMOS transistor (first transistor) 11, FIGS. 17A and 17B are a cross section of the front stage PMOS transistor (third transistor) 13 and a cross section of the front stage NMOS transistor (sixth transistor) 14, respectively.

Figure 18:
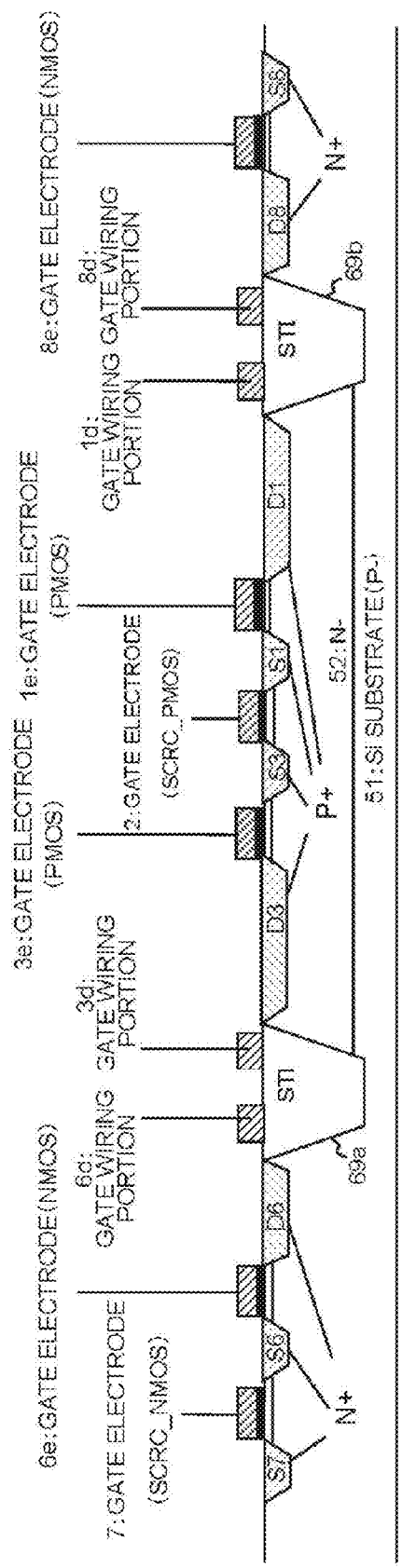
FIG. 18 is a cross section taken along line C-C in FIG. 16.

The C-C cross section in FIG. 18 illustrates the source region S7 of the SCRC transistor T2n, the seventh gate electrode 7, the source region S6 of the front stage NMOS transistor 14, the connecting electrode portion of the sixth gate electrode 6e, the drain region D6 of the front stage NMOS transistor 14, the gate interconnect portions 6d and 3d in the STI 69a, the drain region D3 of an front stage PMOS transistor 13, the connecting electrode portion of the third gate electrode 3e, the source region S3 of the front stage PMOS transistor 13, the second gate electrode 2 of the SCRC transistor T2, the source region S1 of the final stage PMOS transistors 11, the connecting electrode portion of a first gate electrode 1e, the drain region D1 of the final stage PMOS transistor 11, the gate interconnect portions 1d and 8d in the STI 69b, the drain region D8 of the final stage NMOS transistor 12, the connecting electrode portion of the eighth gate electrode 8e, and the source region S8 of the final stage NMOS transistor 12.

In the third exemplary embodiment, a case where power gating that uses the SCRC driver T2n is added to the configuration according to the first exemplary embodiment is illustrated. However, the present disclosure is not limited to such case. Power gating that uses the SCRC driver T2n may be added to the configuration according to the second exemplary embodiment.

As described above, according to the third exemplary embodiment, the following advantageous effects can be obtained, in addition to the advantageous effects according to the first exemplary embodiment.

Even in power gating in which the SCRC driver T2n is arranged between the main ground line 23 and the pseudo-ground line 20, the need for a interconnect connected to the drain region of the SCRC driver T2n can be eliminated. Thus, in such power gating, the interconnect resistance can be reduced, counted as an advantageous effect. If the interconnect resistance connected to the SCRC driver T2n is large, waveform distortion is caused in the power supply potentials of the main ground line 23 and the pseudo-ground line 20, imposing a limit on improvement of the operation speed. However, according to the third exemplary embodiment, since the interconnect resistance is reduced, there is no such problem.

As described above, according to the third exemplary embodiment, not only the power gating between the main power supply line 21 and the pseudo-power supply line 22 according to the first exemplary embodiment, but also the power gating between the main ground line 23 and the pseudo-ground line 20, the interconnect resistance can be reduced.

In FIG. 1, the gate width of the second transistor T2 is smaller than the sum of the gate widths of a plurality of transistors included in a corresponding circuit block 25a. For example, this can be visually understood from FIG. 6 in which the width of the second gate electrode 2 is smaller than the widths of the first gate electrodes 1A to 1C. Under the condition that the power-gate transistor (for example, T2) and the transistors in an inverter stage have the same gate length and gate thickness, the gate width of the transistor T2 illustrated in FIG. 1 is smaller than the sum of the gate widths of a plurality of transistors included in a corresponding circuit block 25a.

Figure 19A:
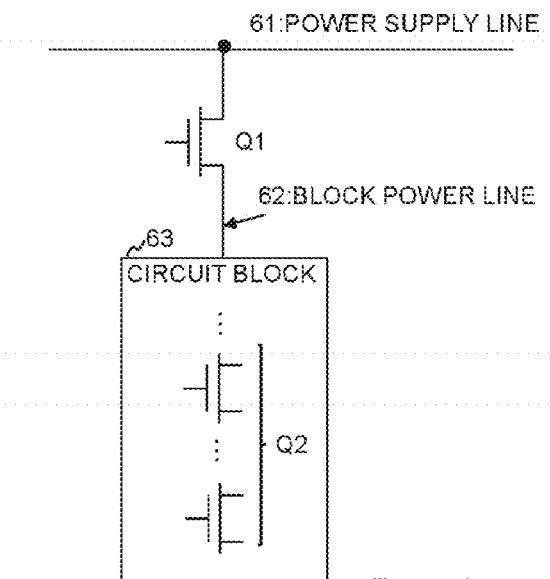
FIG. 19A and FIG. 19B are diagrams for illustrating a relationship of a gate width and gate threshold of transistors included in a circuit block and a SCRC driver.

FIG. 19A is a diagram for illustrating a relationship of a gate width of transistors included in a circuit block and a SCRC driver. A transistor Q1 is called for example a SCRC transistor or a power-gate transistor. A circuit block 63 has a plurality of transistors Q2. A transistor Q1 supplies power supply to the circuit block 63 via a power supply line 61 and a block power line 62. The transistor Q1 is turned on when the corresponding circuit block 63 is activated. The transistor Q1 is turned off when the corresponding circuit block 63 is inactivated.

In the circuit configuration as illustrated in FIG. 19A, it can be explained that a gate width of the transistor Q1 is smaller than a sum of a gate width of the plurality of transistors Q2.

Referring back to FIG. 6 and as can be seen in FIG. 6, it can be understood that a gate width of the gate 2 of the transistor is smaller than a sum of a gate width of the gates 1, 3 of the transistors of the stages 24(24a), 25(25a). For example, a gate width of the PMOS transistor T2 is smaller than a sum of gate width of the PMOS transistor 13 and the PMOS transistor 11.

Referring back to FIG. 1, the gate threshold of the second transistor T2 illustrated in FIG. 1 is smaller than the gate threshold of each transistor included in a corresponding circuit block 25a.

Figure 19B:
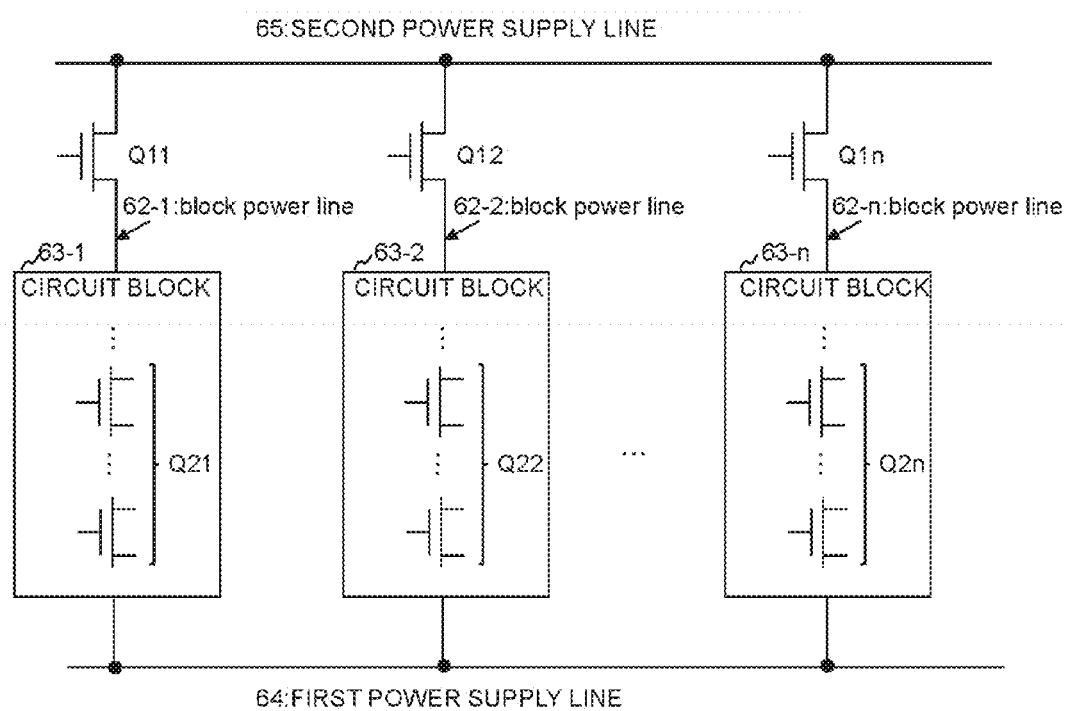

FIG. 19B is a diagram for illustrating a relationship of a gate threshold of transistors included in a circuit block and a SCRC driver.

A plurality of circuit blocks 63-1 to 63-n (n is a positive integer, the same hereinafter) are arranged between a first power supply line 64 and a second power supply line 65 via transistors Q11 to Q1n and block power lines 62-1 to 62-n, respectively. Each of circuit blocks 63-1 to 63-n has a plurality of transistors Q21 to Q2n. Each of transistors Q11 to Q1n is turned on when the corresponding circuit block 63 is activated. Each of transistors Q11 to Q1n is turned off when the corresponding circuit block 63 is inactivated.

In the configuration illustrated in FIG. 19B, a gate threshold of transistors Q11 to Q1n is larger than a gate threshold of each of transistors Q21 to Q2n included in the corresponding circuit block 63. For example, the gate threshold of the transistor Q11 is greater than the threshold gate of each transistor Q21. The gate threshold of the transistor Q12 is greater than the threshold gate of each transistor Q22.

For each of transistors included in the second transistor T2 and the circuit block 25a illustrated in FIG. 1, a gate threshold may be determined by changing only one of the gate thickness, the gate impurity concentration level, and the gate film thickness.

In one example, a gate threshold may be determined by changing values of more than at least two of the gate thickness, the gate impurity concentration level, and the gate film thickness. In another example, a desired gate threshold may be made to the gate threshold by injecting ions such as boron or phosphorus ions under the gate oxide film.

In one example, the power gating circuit as illustrated in FIG. 1 can be used in any circuit requiring reduction of power consumption in a standby state. The power gating circuit as illustrated in FIG. 1 is applicable not only to circuits in a memory device but also to circuits in a logic device, a controller device, a power device, and a sensor device.

In one example, the layouts illustrated in the exemplary embodiments of the present disclosure are used in circuits requiring reduction of power consumption in a standby state. The layout techniques illustrated in the exemplary embodiments are applicable not only to circuits in a memory device but also to circuits in a logic device, a controller device, a power device, and a sensor device, for example.

Embodiments of the present invention are applicable to a semiconductor device that uses a power gating technique.

CONCLUSION

According to an aspect of the present invention, a device includes a first transistor comprising a first gate electrode including first and second parallel electrode portions each extending in a first direction, and a first connecting electrode portion extending in a second direction approximately orthogonal to the first direction and connecting one ends of the first and second parallel electrode portions to each other, and first and second diffusion layers separated from each other by a channel region under the first gate electrode, a first output line connected to the first diffusion layer of the first transistor, and a second transistor comprising a second gate electrode extending in the second direction, and the second transistor being configured to use the second diffusion layer of the first transistor as one of two diffusion layers that are separated from each other by a channel region under the second gate electrode.

According to an aspect of the present invention, a device includes first and second power supply lines being different from each other, a first transistor including a source-drain path coupled between the first and second power supply lines, a second transistor including a source-drain path coupled to the second power supply line and being free from being coupled to the first power supply line, the first transistor being shorter in a gate width than the second transistor, and the first and second transistor having a common diffusion region shared in common thereby.

According to an aspect of the present invention, a device includes first and second power supply lines, a first transistor including a source-drain path coupled between the first and second power supply lines, a second transistor including a source-drain path coupled to the second power supply line and being free from being coupled to the first power supply line, and a third transistor including a source-drain path coupled to the first power supply line and being free from being coupled to the second power supply line, the first transistor further including a first diffusion region configured to be shared by the second transistor and be free from being shared by the third transistor, and a second diffusion region configured to be shared by the third transistor and be free from being shared by the second transistor.

Modifications and adjustments of the exemplary embodiments are possible within the scope of the overall disclosure (including the claims and drawings) of the present invention and based on the basic technical concept of the present invention. Various combinations and selections of various disclosed elements (including the elements in each of the claims, exemplary embodiments, drawings, etc.) are possible within the scope of the claims of the present invention. Namely, the present invention of course includes various variations and modifications that could be made by those skilled in the art according to the overall disclosure including the claims and drawings and the technical concept. The description discloses numerical value ranges. However, even if the description does not particularly disclose arbitrary numerical values or small ranges included in the ranges, these values and ranges should be deemed to have been specifically disclosed.

What is claimed is:

1. A device, comprising:
   a first transistor comprising:
      a first gate electrode including first and second parallel electrode portions each extending in a first direction, and a first connecting electrode portion extending in a second direction orthogonal to the first direction and connecting one ends of the first and second parallel electrode portions to each other; and
      first and second diffusion layers separated from each other by a channel region under the first gate electrode;
   a first output line connected to the first diffusion layer of the first transistor;

a second transistor comprising a second gate electrode extending in the second direction, and the second transistor being configured to use the second diffusion layer of the first transistor as one of the diffusion layers that are separated from each other by a channel region under the second gate electrode.

2. The device according to claim 1, comprising:

a first line connected to the other of the two diffusion layers separated from each other by the channel region under the second gate electrode of the second transistor and supplying a first power supply potential; and a second line connected to the second diffusion layer of the first transistor.

3. The device according to claim 1, further comprising:

a third transistor comprising a third gate electrode including third and fourth parallel electrode portions each extending in the first direction, and a second connecting electrode portion extending in the second direction and connecting one ends of the third and fourth parallel electrode portions; and third and fourth diffusion layers separated from each other by a channel region under the third gate electrode; and a first intermediate line connected the third diffusion layer of the third transistor and the first gate electrode of the first transistor to each other;

the second transistor being configured to use the fourth diffusion layer of the third transistor as the other of the two diffusion layers separated from each other by the channel region under the second gate electrode.

4. The device according to claim 3;

wherein the first and third transistors are respectively duplicated to be plural and are formed side by side in the second direction.

5. The device according to claim 1, further comprising:

a fourth transistor comprising:

a fourth gate electrode including fifth and sixth parallel electrode portions each extending in the first direction, and a third connecting electrode portion extending in the second direction and connecting one ends of the fifth and sixth parallel electrode portions, and the other ends of the fifth and sixth parallel electrode portions being connected respectively to the second gate electrode; and the fourth transistor being configured to use the second diffusion layer of the first transistor as one of two diffusion layers separated from each other by a channel region under the fourth gate electrode; and a fifth transistor comprising:

a fifth gate electrode including seventh and eighth parallel electrode portions each extending in the first direction, and a fourth connecting electrode portion extending in the second direction and connecting one ends of the seventh and eighth parallel electrode portions, and the other ends of the seventh and eighth parallel electrode portions being connected respectively to the second gate electrode; and the fifth transistor being configured to be free from using the second diffusion layer of the first transistor as one of two diffusion layers separated from each other by a channel region under the fifth gate electrode.

6. The device according to claim 5;

wherein the first transistors, the fourth transistors, and the fifth transistors are respectively duplicated to be plural and are formed in the second direction.

7. The device according to claim 1;

wherein the first and second transistors are of a first conductivity type;

wherein the device comprises:

a sixth transistor being of a second conductivity type and comprising:

a sixth gate electrode including ninth and tenth parallel electrode portions each extending in the first direction, and a fifth connecting electrode portion extending in the second direction and connecting one ends of the ninth and tenth parallel electrode portions; and fifth and sixth diffusion layers separated from each other by a channel region under the sixth gate electrode; and a seventh transistor being of a second conductivity type and comprising:

a seventh gate electrode extending in the second direction; and the seventh transistor being configured to use the sixth diffusion layer of the sixth transistor as one of two diffusion layers separated from each other by a channel region under the seventh gate electrode.

8. The device according to claim 7, further comprising:

a third line connected to the other of the two diffusion layers separated from each other by the channel region under the seventh gate electrode of the seventh transistor and supplying a second power supply potential; and a fourth line connected to the sixth diffusion layer of the sixth transistor.

9. The device according to claim 7;

wherein the first transistor and the sixth transistor are respectively duplicated to be plural and are formed side by side in the second direction.

10. The device according to claim 1;

wherein the second gate electrode of the second transistor includes a first gate portion shaped in a ring.

11. A device comprising:

first and second power supply lines being different from each other;

a first transistor including a source-drain path coupled between the first and second power supply lines;

a second transistor including a source-drain path coupled to the second power supply line and being free from being coupled to the first power supply line;

the first transistor being shorter in a gate width than the second transistor, and the first and second transistor having a common diffusion region shared in common thereby;

wherein the first transistor comprises:

a first gate electrode including first and second parallel electrode portions each extending in a first direction, and a first connecting electrode portion extending in a second direction approximately orthogonal to the first direction and connecting one ends of the first and second parallel electrode portions to each other; and the second transistor comprises:

a second gate electrode extending in the second direction.

12. The device according to claim 11, wherein the first gate electrode of the first transistor further comprises:

third and fourth parallel electrode portions each extending in the first direction, and a second connecting electrode portion extending in the second direction and connecting one ends of the third and fourth parallel electrode portions to each other.

13. The device according to claim 11, wherein the first transistor is configured to be a power-gate transistor for the second transistor.

14. The device according to claim 11, wherein the first transistor is configured to prevent a current from flowing via the source-drain path thereof to the second power supply line when the second transistor is rendered non-conductive.

15. The device according to claim 11, wherein the second transistor comprises a first gate portion shaped in ring.

16. A device comprising:
first and second power supply lines;
a first transistor including a source-drain path coupled between the first and second power supply lines;
a second transistor including a source-drain path coupled to the second power supply line and being free from being coupled to the first power supply line;
a third transistor including a source-drain path coupled to the first power supply line and being free from being coupled to the second power supply line, and
the first transistor further including a first diffusion region configured to be shared by the second transistor and be free from being shared by the third transistor, and a second diffusion region configured to be shared by the third transistor and be free from being shared by the second transistor;

wherein the first transistor comprises:
a second gate electrode extending in the second direction,
the second transistor comprises:
a first gate electrode including first and second parallel electrode portions each extending in a first direction, and a first connecting electrode portion extending in a second direction that is orthogonal to the first direction and connecting one ends of the first and second parallel electrode portions to each other; and
the third transistor comprises:
a third gate electrode including third and fourth parallel electrode portion extending in the first direction and a second connection electrode portion connecting one ends of the third and fourth parallel electrode portions to each other.

17. The device according to claim 16, wherein the first transistor is configured to be a power-gate transistor for the second transistor.

18. The device according to claim 16, wherein the first transistor is configured to prevent a current from flowing via a source-drain path thereof to the second power supply line when the second transistor is rendered non-conductive.

* * * * *